United States Patent
Barczyk

(10) Patent No.: US 10,139,432 B2
(45) Date of Patent: Nov. 27, 2018

(54) METHODS AND SYSTEMS RELATING TO IMPROVED AC SIGNAL PERFORMANCE OF DUAL STAGE TRANSFORMERS

(71) Applicant: Guildline Instruments Limited, Smiths Falls (CA)

(72) Inventor: Tomasz Barczyk, Ottawa (CA)

(73) Assignee: Guildline Instruments Limited (CA)

( * ) Notice: Subject to any disclaimer, the term of this patent is extended or adjusted under 35 U.S.C. 154(b) by 79 days.

(21) Appl. No.: 15/220,058

(22) Filed: Jul. 26, 2016

(65) Prior Publication Data
US 2016/0334443 A1 Nov. 17, 2016

Related U.S. Application Data

(63) Continuation of application No. 14/518,602, filed on Oct. 20, 2014, now Pat. No. 9,829,512.

(60) Provisional application No. 61/893,415, filed on Oct. 21, 2013.

(51) Int. Cl.
*G01R 15/18* (2006.01)
*G01R 19/00* (2006.01)

(52) U.S. Cl.
CPC ......... *G01R 15/183* (2013.01); *G01R 15/185* (2013.01); *G01R 19/0092* (2013.01)

(58) Field of Classification Search
None
See application file for complete search history.

(56) References Cited

U.S. PATENT DOCUMENTS

| | | | |
|---|---|---|---|
| 4,613,841 A | 9/1986 | Roberts | |
| 4,749,939 A | 6/1988 | Seitz | |
| 7,309,980 B2 | 12/2007 | Mende et al. | |
| 7,348,845 B2 | 3/2008 | Giovannotto | |
| 8,421,444 B2 * | 4/2013 | Gunn | G01R 15/185 323/357 |
| 9,829,512 B2 | 11/2017 | Barczyk | |
| 2009/0108833 A1 | 4/2009 | Ziegler | |

(Continued)

OTHER PUBLICATIONS

An Improved Two-Stage Current Transformer, James L. West et al. IEEE Transactions on Instrumentation and Measurement, vol. 40. No. 3, Jun. 1991.*

(Continued)

*Primary Examiner* — Jermele M Hollington
*Assistant Examiner* — Douglas X Rodriguez
(74) *Attorney, Agent, or Firm* — Akerman LLP

(57) ABSTRACT

Accurate measurements of electrical power at various points of a power grid is becoming more important and, at the same time, is getting more difficult as the old power distribution model of a few, large power generating stations and a multitude of relatively linear loads is replaced by a newer model containing a multitude of smaller, and to some degree unpredictable power sources, as well as a multitude of not always linear and often smart (essentially also unpredictable) loads. Embodiments of the invention provide for management of AC current measurements in the presence of a DC current. Such current measurement management including at least alarms, feedback, and forward correction techniques exploiting magnetic field measurements from within the magnetic core or upon the surface of magnetic elements and/or shields within the current transducer.

20 Claims, 16 Drawing Sheets

(56) References Cited

U.S. PATENT DOCUMENTS

2009/0219009 A1* 9/2009 Jansen ................ G01R 15/183
324/127

OTHER PUBLICATIONS

Brooks et al., "The Two-Stage Current Transformer", AIEE Trans., vol. 41, pp. 382-393, 1922.

* cited by examiner

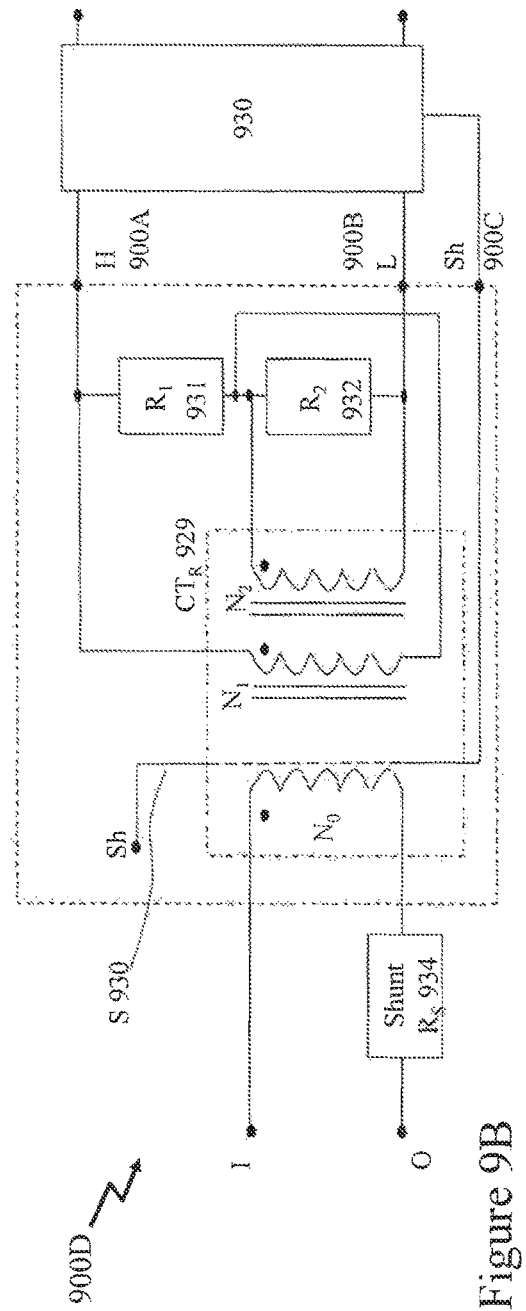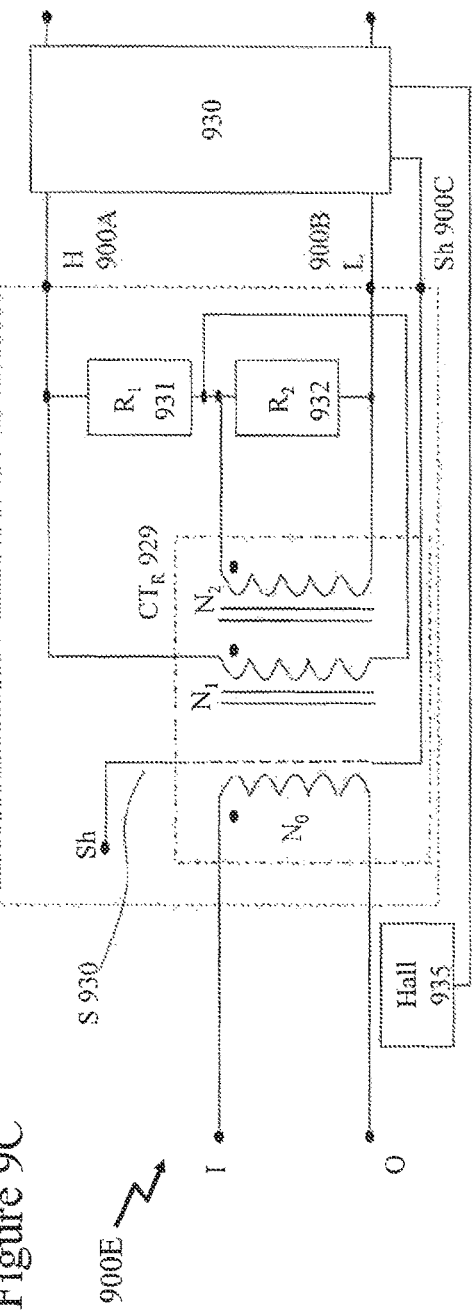
Figure 9B
Figure 9C

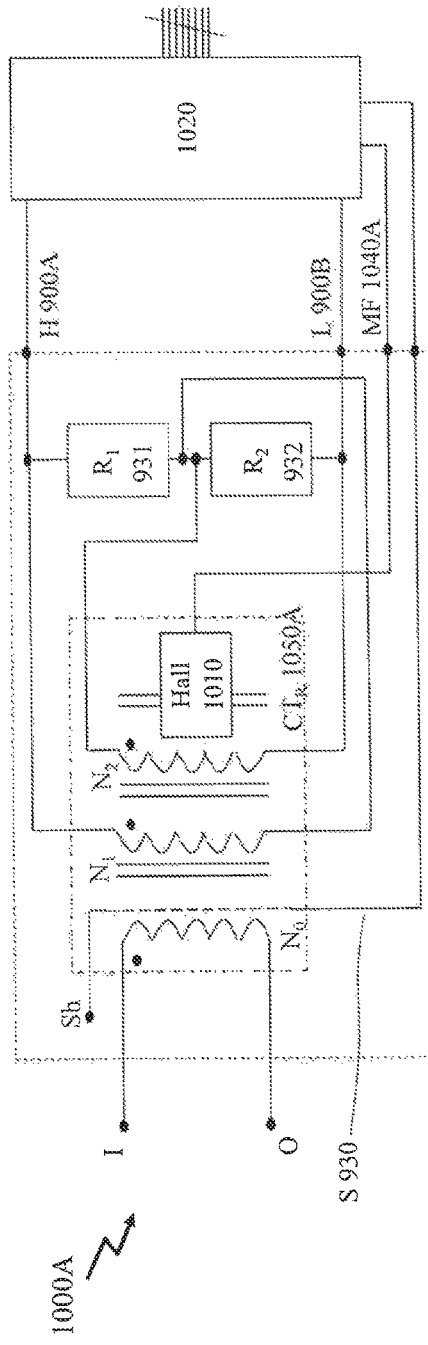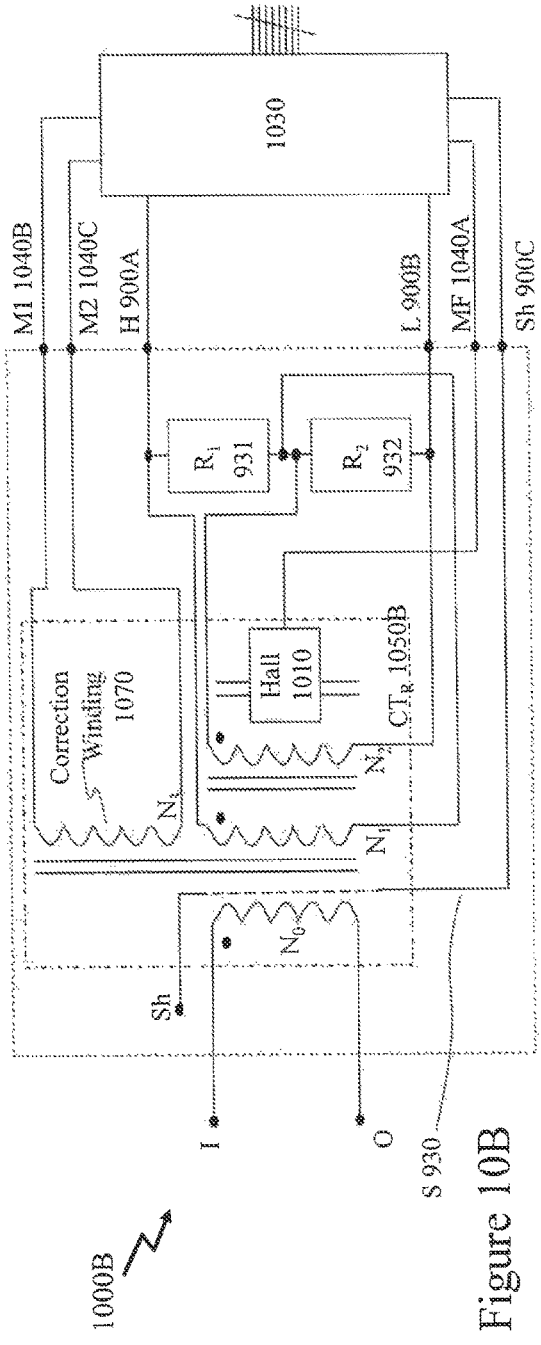
Figure 10A
Figure 10B

METHODS AND SYSTEMS RELATING TO IMPROVED AC SIGNAL PERFORMANCE OF DUAL STAGE TRANSFORMERS

CROSS REFERENCE TO RELATED APPLICATIONS

This patent application claims the benefit as a continuation of U.S. patent application Ser. No. 14/518,602 entitled "Methods and Systems Relating to AC Current Measurements" filed Oct. 20, 2014 which itself claims benefit of priority from United States of America Provisional Patent Application U.S. 61/893,415 filed Oct. 21, 2013 entitled "Methods and Systems Relating to AC Current Measurements."

FIELD OF THE INVENTION

This invention relates generally to precision AC measurements, which include precision AC current, voltage, phase, impedance, frequency, power and energy measurements, in the current range from 1 mA or less to 20 kA or greater and voltage range of IV or less to 1000 kV or greater and in a frequency range from a few hertz to one hundred kilohertz. In particular, it relates, but is not limited to AC measurements as applicable in power transmission and distribution networks.

BACKGROUND OF THE INVENTION

The accurate Alternating Current (AC) measurement of electrical power at various points of a power grid is becoming more and more important and, at the same time, is getting more and more difficult. The old power distribution model of a few, large power generating stations and a multitude of relatively linear loads is being replaced by a newer model containing a multitude of smaller, and to some degree unpredictable power sources, as well as a multitude of not always linear and often smart (essentially also unpredictable) loads. This change deteriorates power quality and makes AC measurements, grid management and troubleshooting more difficult. Also, the increasing cost of electrical power makes precise calculation of delivered energy and monitoring of power quality important.

There are three main categories of AC power measurement systems: The highest level of accuracy systems, used typically by the Standard and Calibration Laboratories, are developed to reference measurement to the National Standards. These are typically unique installations, not covered by specific regulatory requirements. The next category is high precision AC power measurement systems. In the important case of AC power measurement instruments, usually referred to as Power Analyzers, these would be units meeting the requirements of standards, such as for example International Standard IEC 61000-4-30 "Electromagnetic Compatibility: Part 4—30 Testing and Measurement Techniques—Power Quality Measurement Methods" which relates to Class A measurement methods. These are used where precise measurements are necessary, for example for contractual applications and disputes, verifying compliance with standards, etc. Two different Class A instruments, when measuring the same quantities, should produce matching results within the specified uncertainty for that parameter. The third main category of the AC power measurement system is general use instruments. Generally, it is recommended that this group reflect measurement methods and intervals of Class A instruments, with lower precision and processing requirements. It is then classified as Class S. Other instruments including legacy installations, whose operation doesn't reflect methods of Class A, but still meet key accuracy requirements, are summarily called Class B. Irrespective of the class of the AC power measurements they require determination of the voltage, current, frequency, phase, and relative timing of the single or multiple phases of the power system in order to perform the measurements.

The whole measurement chain of electrical quantity for power analysis consists of measurement transducer, measurement unit and evaluation unit (as is defined in the ICE 61000-4-30 standard). The measurement transducer converts the input quantity to a level and a kind suitable for the measurement unit and typically has some other functionality, for example signal isolation or overload protection. For example, the measurement transducer may reduce a power line voltage of hundreds of kilovolts to tens of volts. The measurement unit then converts the input quantity, typically to a digital form, suitable for evaluation. Then the evaluation unit, which is typically some form of a computing device, receives and combines data streams from different input channels including for example the output of the measurement unit and a reference unit, and does the required calculations to produce results. Test results can be: recorded, aggregated, automatically evaluated in the real time, displayed on the instrument screen, used to generate alarms, placed in system logs, and send out for external evaluation and storage, etc.

Generally, AC electrical measurements are used in a wide variety of applications and may be performed for a variety of electrical quantities including voltage, current, capacitance, impedance, resistance etc. These tests and measurements include those relating to designing, evaluating, maintaining and servicing electrical circuits and equipment from high voltage electrical transmission lines operating at hundreds of kilovolts (kV) and kiloamps (kA) to industrial/medical/residential electrical and lighting, typically 400V/240V/100V and 30/15 A, to a wide variety of industrial/scientific/medical/consumer electrical and electronic devices.

Within a variety of applications and test equipment systems the measurement transducer is often a toroidal transformer. These allow for the measurement system to measure the required parameter(s) with the measurement system electrically isolated from the electrical system being measured. Further, toroidal forms of the core of the transformer provide best magnetic performance of the core, providing low magnetic reluctance, good uniformity of the magnetic field and low flux leakage, resulting in the best electrical parameters of the transformer. In general, the toroidal form of the core of the transformer is an accepted standard for meteorological applications.

However, with the continued drive for improved accuracy in calibration, standards, and measurements on circuits and components operating at hundreds of kiloVolts, thousands of Amps, with resistances into Gigaohms accuracies of parts per million is being replaced by parts per billion. At the same time as discussed supra such measurements are being performed upon, for example, electrical power distribution systems at various points of a power grid with a variety of generators, distribution systems, etc. with unknown or variable characteristics. On the other hand, even the best toroidal core transformers still have three basic limitations, affecting performance of the transducer, namely saturation of the core, finite value of the permeability and finite width of the hysteresis loop. Each one affects operation of the transformer and may limit overall accuracy of the resulting transducer. The first and most obvious way to improve performance of the measurement transformer is to use highest permeability, lowest losses (narrowest hysteresis loop) magnetic materials for the core.

Next, the inventors have established a measurement and correction methodology for AC current transducers designing multi-core, multi-stage transformers compensating effects of finite, changing burden. Similarly, DC compensation was introduced to improve AC operation of the measurement transformer in the presence of the DC components magnetizing the transformer core. Beneficially, such measurement and correction methodologies provide instrument designers with multiple options ranging from low cost alarms through to higher cost automated correction hardware software and firmware based circuits.

Such measurement and correction methodologies would beneficially allow such devices according to some embodiments of the device to achieve performance approaching that of reference measurements operating in laboratory conditions. It would be further beneficial if the same principles provide power utilities, independent electricity producers, electrical engineers and technicians, and others requiring accurate measurements of power systems with a field deployable power system measurement devices providing up to Class A type performance but in rugged devices of reduced cost and complexity.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to provide measurement and correction methodologies for DC currents within precision AC measurement instruments, which include precision AC current, voltage, phase, impedance, frequency, power and energy instruments, operating in the current range from 1 mA or less to 20 kA or greater and voltage range of IV or less to 1000 kV or greater and in a frequency range from a few hertz to one hundred kilohertz. In particular, the invention relates to, but is not limited to AC measurements as applicable in power transmission and distribution networks.

In accordance with an embodiment of the invention there is provided a method comprising measuring a DC signal, the DC signal generated in dependence upon a DC aspect of a signal, measuring an AC signal, the AC signal generated in dependence upon an AC aspect of the signal, and generating a corrected measurement of the measured AC signal.

In accordance with an embodiment of the invention there is provided a device comprising:
a dual stage current transformer comprising a plurality of magnetic cores, a primary winding, a first secondary winding, and a second secondary winding;
a first resistor coupled across the first secondary winding generating a first voltage;
a second resistor coupled across the second secondary winding disposed in series with the first resistor to add a compensating voltage to the first voltage;
a DC magnetic sensor coupled to a first magnetic core of the plurality of magnetic cores for generating a signal proportional to a DC magnetic field within the dual stage current transformer; and
a flux compensation winding coupled to a second magnetic core of the plurality of magnetic cores for generating a magnetic flux to reduce the DC magnetic field within the dual stage current transformer.

In accordance with an embodiment of the invention there is provided method comprising using a DC magnetic sensor and flux compensation in conjunction with a dual stage current transformer, wherein the dual stage transformer uses resistors to add voltages rather than adding currents.

In accordance with an embodiment of the invention there is provided a method comprising integrating a magnetic sensor within a magnetic core of a plurality of magnetic cores within a dual stage current transformer allowing operation of the sensor with small AC flux components and improved AC to DC signal ratio.

In accordance with an embodiment of the invention there is provided a device comprising a dual stage current transformer comprising a plurality of magnetic cores, a primary winding, a first secondary winding, and a second secondary winding and a DC magnetic sensor coupled to a first magnetic core of the plurality of magnetic cores for generating a signal proportional to a DC magnetic field within the dual stage current transformer.

In accordance with an embodiment of the invention there is provided a device comprising a current comparator comprising a magnetic core, a primary winding wound around the magnetic core, a secondary winding wound around the magnetic core, and a magnetic sensor coupled to a magnetic field generated in dependence upon a first current within the primary winding and a second current within the secondary winding, wherein the primary and secondary windings are wound around the magnetic core directly without a magnetic shield disposed between any of the magnetic core, the primary winding, and the secondary winding.

In accordance with an embodiment of the invention there is provided a current comparator based sensor comprising:
a magnetic core;
a primary winding wound around the magnetic core for connecting to an electrical circuit:
a secondary winding wound around the magnetic core;
a magnetic sensor coupled to the magnetic field within the magnetic core;
a control circuit for generating and applying a magnetization current to at least one of the primary winding and a tertiary winding wound around the magnetic core, wherein the magnetization current sequentially cycles the magnetic core to saturation in opposite directions; and
a measurement circuit coupled to at least the secondary winding for determining timing information relating to the cycling of the magnetic core and establishing a magnetization field strength therefrom and the current flowing in the primary winding due to the electrical circuit.

In accordance with an embodiment of the invention there is provided a current comparator comprising:
a magnetic field sensor;
a primary winding for connecting to an electrical circuit disposed either above or around the magnetic field sensor; and
a secondary winding for generating a current to be employed in determining a current flowing within the electrical circuit disposed below the magnetic field sensor when the primary winding is disposed above and around the magnetic field sensor between the primary winding and the magnetic field sensor when the primary winding is around the magnetic field sensor.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 9A-9C depict schematically electrical circuits of multi-core current transformers according to embodiments of the invention;

FIGS. 10A-10C depict schematically electrical circuits of multi-core current transformers according to embodiments of the invention;

DETAILED DESCRIPTION OF THE PREFERRED EMBODIMENT

This invention relates generally to precision AC measurements, which include precision AC current, voltage, phase, impedance, frequency, power and energy measurements, in the current range from 1 mA or less to 20 kA or greater and voltage range of IV or less to 1000 kV or greater and in a frequency range from a few hertz to one hundred kilohertz. In particular, it relates, but is not limited to AC measurements as applicable in power transmission and distribution networks.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Precise AC power measurements require precise determination of the voltage, current and timing of the single or multiple phases. However, as evident in FIGS. 1 and 2 the ratio of a measured AC current, I, with varying DC current relative to the measured AC current, $I_O$, at no DC current is not equal to one, i.e. $I/I_O=1$, with varying DC current but varies substantially with DC current and magnitude of the AC current being measured. For an applied AC current of 510 A the ratio exceeds 1.01 at approximately 1 ampere turn (AT). This represents an error of 1% or 10,000 parts per million or 10 million parts per billion. Accordingly, when considering test instrumentation providing accuracies of a few parts per million it is evident that poor signal conditioning of the signal being measured will result in errors that dwarf those from the measurement instrument itself. Clearly significant control of the DC current is required in order achieve the intrinsic accuracy of the test instrument.

Figure 3:
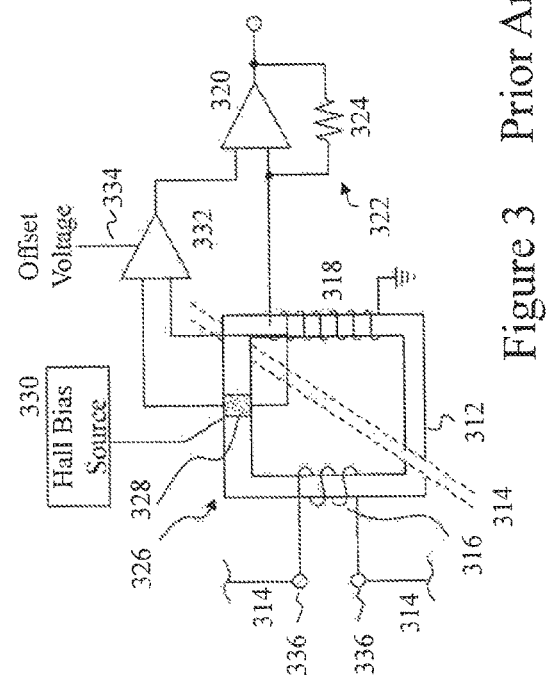
FIG. 3 depicts a current sensing circuit for a measurement probe according to the prior art of U.S. Pat. No. 7,309,980 for a single core transformer.

Within the prior art techniques these have been techniques presented to combine AC and DC current sensing. One such example is presented within FIG. 3 according to the prior art of Mende et al in U.S. Pat. No. 7,309,980 for a single core transformer in respect of current sensing circuit for a measurement probe. As depicted there is a ring-shaped core 312 of magnetic material defining an aperture. A current carrying conductor 214 is coupled in a flux linking relationship with ring-shaped magnetic core 312. The current carrying conductor 314 is preferably linked to the ring-shaped magnetic core 312 via a multi-turn primary winding 316 that is coupled in series with the current carrying conductor 314. Alternately, the current carrying conductor 314 may be inserted through the aperture in the ring-shaped magnetic core 312 and act as the primary winding 316. The current to be measured in the current carrying conductor 314 produces a magnetic flux in the magnetic core 312 and is linked to a multi-turn secondary winding 318. One terminal of the secondary winding 318 is coupled to ground with the other terminal being coupled to the inverting input terminal of a transimpedance amplifier 320. The inverting input terminal of the transimpedance amplifier 320 is coupled to the output terminal of the amplifier 320 via a current signal path 322 having a transimpedance resistor 324. Thus the primary winding 316 or alternately the current carrying conductor 314, the magnetic core 312 and the secondary winding 318 function as a transformer 326. A magneto-electric converter 328 is disposed within the magnetic core 312 substantially perpendicular to the lines of flux in the magnetic core 312. The magneto-electric converter 328 is preferably a thin film semiconductor Hall effect device having a first pair of terminals coupled to a bias source 330 and a second pair of terminals connected to differential inputs of amplifier 332. In an embodiment of the invention, the amplifier 332 is a high gain differential amplifier having low noise and high common mode rejection the single ended output of the differential amplifier 332 is coupled to the non-inverting input of the transimpedance amplifier 320. Accordingly, the transimpedance amplifier 320 functions as a power amplifier for DC to low frequency current signals and a transimpedance gain amplifier for higher frequency signals. In this manner the overall circuit acts as a DC to high frequency current probe but no correction of the AC portion of the circuit for DC currents is considered.

Figure 4:
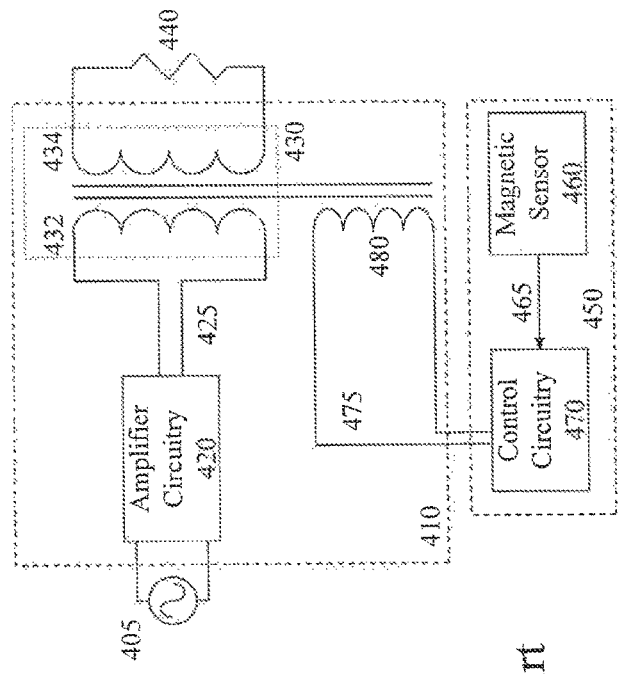
FIG. 4 depicts a transformer correction approach according to the prior art of U.S. Pat. No. 7,348,845 for a single core transformer.

Referring to FIG. 4 there is depicted a transformer correction approach according to the prior art of Giovannotto in U.S. Pat. No. 7,348,845 for a single core transformer. As depicted the system comprises an amplifier 410 and variable magnetic flux bias system 450. Amplifier 410 comprises amplifier circuitry 420, amplifier signal line 425, output transformer 430, primary winding 432, secondary winding 434, control winding 480, and optionally load 440. Amplifier 410 receives input signals from signal source 405, and provides amplified output signals to load 440. Variable magnetic flux bias system 450 comprises magnetic sensor 460, flux signal line 465, control circuitry 470, and control signal line 475.

Amplifier circuitry 420 may be any audio amplifier known in the prior art that uses an output transformer, such as output transformer 430, and may comprise vacuum tubes in a triode, tetrode, or pentode configuration, or may comprise solid state devices. Amplifier circuitry 420 may be operated in bias modes including, but not limited to, Class A, Class AB(1), Class AB(2), Class B, Class C, or Class D.

Variable magnetic flux bias system 450 uses magnetic sensor 460 to sense a first magnetic flux in the proximity of output transformer 430. The first magnetic flux is a portion of the leakage magnetic flux emanating from output transformer 430. Magnetic sensor 460 may be a linear-output Hall-Effect sensor. In other embodiments, magnetic sensor 460 may include, but is not limited to a magnetoresistive sensor, a fluxgate sensor, a superconducting quantum interference device (SQUID) sensor, or an electron-spin sensor.

By placing magnetic sensor 460 in proximity to output transformer 430, the first magnetic flux of output transformer 430 may be sensed, generating a flux signal on flux signal line 465. The first magnetic flux has components representing a portion of the total magnetic flux within the transformer, comprising both the desired higher-frequency amplifier signal from signal source 405 and the undesired DC and low-frequency subsonic components.

Flux signal line 465 is coupled to control circuitry 470. Control circuitry 470 is configured to receive the flux signal from flux signal line 465 and to generate a control signal on control signal line 475 representing the undesired DC and low-frequency subsonic components of the first magnetic flux of output transformer 430.

Control winding 480 is coupled to control circuitry 470 via control signal line 475, and thereby receives the control signal. Using the received control signal, control winding 480 induces a second magnetic flux in output transformer 430 that may set a non-zero quiescent magnetic bias level in output transformer 430. Alternatively, control circuitry 470 may generate a control signal that causes control winding 480 to induce a second magnetic flux that substantially cancels out or nulls the undesired DC and low-frequency subsonic components of the first magnetic flux in output transformer 430. Control winding 480 may be a spare or unused winding in output transformer 430, or may be added after output transformer 430 is manufactured. Control winding 480 may be a primary winding or a secondary winding of output transformer 430. Control winding 480 may be multiple individual windings coupled to control signal line 475.

In one embodiment, control circuitry 470 may be adjusted so that a quiescent magnetic bias level is maintained within output transformer 430. The quiescent magnetic bias level may be maintained at a level different from zero. In another embodiment, control circuitry 470 may be adjusted so that the second magnetic flux substantially cancels or nulls out the DC and low-frequency subsonic components of the first magnetic flux, and thus minimizes the magnetic saturation within output transformer 430. Control circuitry 470 may be implemented using operational amplifiers, or alternatively using a proportional integral (PI) or proportional-integral-derivative (PID) control loop comprising a digital signal processor or microcontroller.

Figure 5:
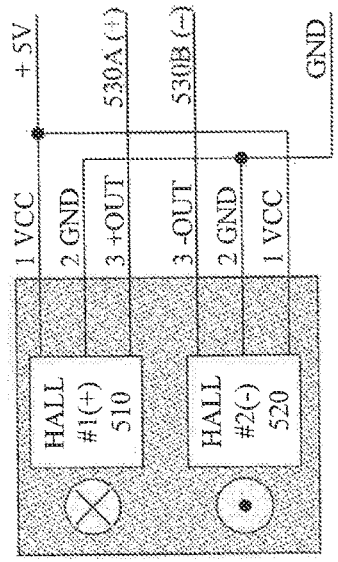
FIG. 5 depicts Hall current sensor circuit configurations according to an embodiment of the invention.

Referring to FIG. 5 there is depicted a Hall sensor circuit board according to an embodiment of the invention wherein first and second Hall sensors Hall #1 510 and Hall #2 120 respectively which detect opposite sense magnetic fields, (+) and (−) respectively. As depicted in FIG. 5 each Hall sensor is connected to +5V and GND power supply rails and generates an output signal coupled to output ports 530A and 530B respectively for (+) and (−) field directions respectively. Whilst a pair of Hall sensors are depicted a single Hall sensor, or multiple hall sensors may also be employed. Similarly, non-differential configurations of a pair of Hall sensors may also be employed.

In each the Hall sensors are inserted within holes in the circuit board in order to reduce the vertical dimensions of the Hall sensor circuit board as this impacts the performance of the magnetic core of the transformer within which it is to be inserted as minimizing the profile of the sensor/circuit board reduces the size of the slot that has to be cut into the core of the current transformer transducer. Surrounding the Hall sensor devices and the circuit board which is inserted into the transformer core is a protective film or layer which may be wrapped, such as in the example of using a protective film or tape or deposited such as for example by dip coating. The circuit board may be formed from one or more standard circuit materials known within the prior art including, but not limited to, FR-4, FR-6, CEM-3, CEM-4, G-10, alumina, and aluminum nitride. It would be evident that other circuit board designs may be employed as well as that the number and orientation of the Hall effect sensors may be varied together with their integration into different numbers of packages. For example, a custom Hall sensor package may employ 4 Hall effect sensors orientated at right angles to one another with 2 measuring (+) fields within the core and the others measuring (−) fields within the core relative to the sensors. Similarly, placement may be adjusted in respect of the design of the core. Beneficially pre-packaged sensors allow for pre-screened components in hermetic packages if appropriate although non-hermetic and discrete die options may be considered as well as a discrete ceramic package having internally the sensors and appropriate circuit tracks.

Figure 6:
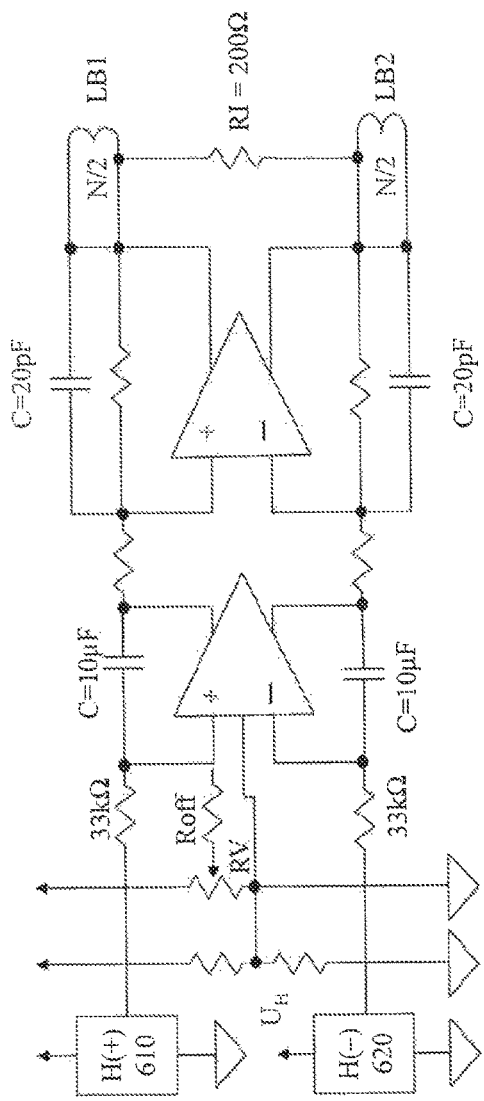
FIG. 6 depicts a dual stage driver circuit for a Hall current sensor according to an embodiment of the invention.
Figure 7:
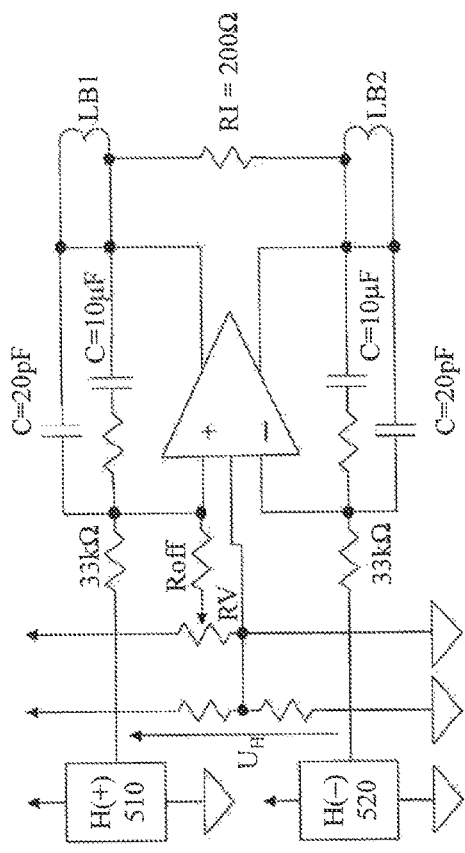
FIG. 7 depicts a single stage driver circuit for a Hall current sensor according to an embodiment of the invention.

Now referring to FIG. 6 there is depicted a dual-stage driver circuit for use in conjunction with first and second Hall sensors Hall #1 610 and Hall #2 620 respectively according to an embodiment of the invention. As depicted two operational amplifiers (op-amps) such as Texas Instruments THS4521 Fully-Differential Amplifiers are employed with an output generated across output resistor RI in proportion to the field measured. FIG. 7 depicts a corresponding single stage driver according to an embodiment of the invention.

Figure 8:
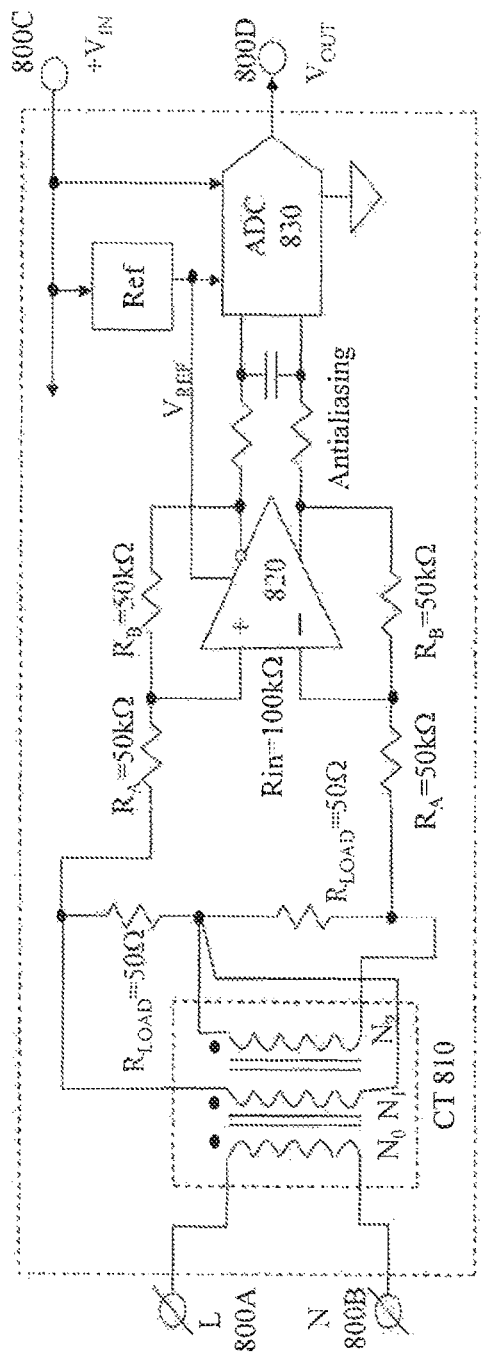
FIG. 8 depicts a two-stage current transformer and associated electrical interface circuit according to an embodiment of the invention.

Referring to FIG. 8 there is depicted an exemplary circuit according to an embodiment of the invention to generate a digital representation of an input analog signal applied across the L and N terminals 800A and 800B respectively. As depicted a current transformer (CT) 810 with primary winding of $N_0$ turns is coupled to the L and N terminals 800A and 800B. A first secondary winding of $N_1$ turns is coupled to a first load resistor, $R_{LOAD1}$=50Ω and a second secondary winding of turns is coupled across a second load resistor, $R_{LOAD1}$=50Ω, which is serially connected to the first load resistor. The outer connections of the first and second load resistors are coupled to the + and − inputs of a differential operational amplifier (OpAmp) 820 via resistors, $R_A$=100 kΩ. The differential outputs of the differential OpAmp 820 are each fed back via feedback resistors $R_B$=50 kΩ and coupled via anti-aliasing circuitry to ADC 830, such as for example an Analog Devices ADS1271 which provides a 24-bit delta-sigma analog-to-digital converter (ADC) at 105 kSPS and 51 kHz bandwidth. The ADC 830 output is coupled to output 800D. The reference voltage, ADC 830 power, and differential OpAmp 820 power are supplied via third input 800C, $+V_{IN}$.

Figure 9A:
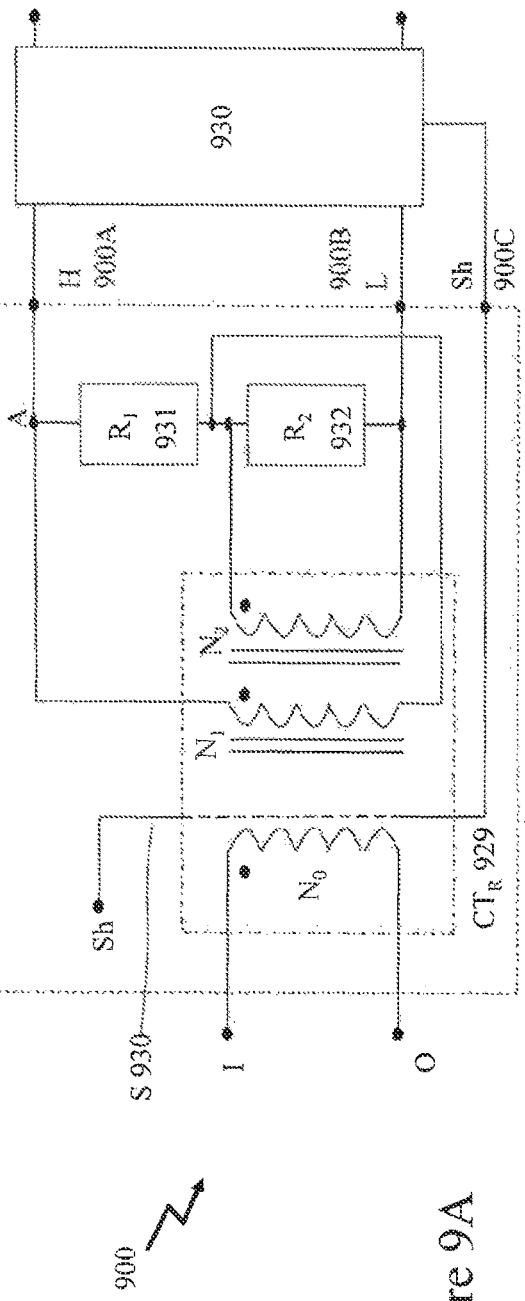

Now referring to FIG. 9A there is depicted an embodiment of a Current Transducer (CT) 900 according to the prior art exploiting a dual-stage design wherein the signal induced within a first secondary windings $N_1$ has a corrective signal applied which is generated by second secondary winding $N_2$. CT 900 being a dual stage CT without DC bias compensation. CT 900 consists of a dual stage current transformer $CT_R$ 929 containing primary winding $N_0$ and first and second secondary windings $N_1$ and $N_2$ respectively. The Current Transducer 929 primary input terminal $I_{IN}$ is connected to the start connection of the primary winding $N_0$, while the end connection of $N_0$ is connected to the primary output terminal Iour. An electrical shield S 930 is placed between the primary and the secondary sides and connected to a dedicated shield terminal Sh 900C. Winding $N_1$ is loaded with a precise resistance $R_1$ 931 and second stage winding $N_2$ is loaded with a precise resistance $R_2$ 932. The High output terminal H 900A of the Current Transducer 900 is connected to the start connection of secondary winding $N_1$, while the end connection of winding $N_1$ is connected to the start connection of second stage winding $N_2$. End connection of second stage winding $N_2$ is connected to the Low output terminal L 900B of the transducer. Accordingly, current passing through the primary winding $N_0$ produces a proportional voltage between output terminals H 900A and L 900B wherein the winding $N_1$/precise resistance $R_1$ 931 combination provides a correction current applied to that generated by second stage winding $N_2$; precise resistance $R_2$ 932. The High and Low output terminals H 900A and L 900B together with shield terminal Sh 900C are coupled to processing circuit 930.

Optionally a switchable resistor, i.e. a resistor switchable into the circuit or selectable between a first fixed resistance value and no resistance, is coupled between the winding N1 and point A during manufacturing testing. Accordingly, if a variation in the signal at the H and L terminals 1000A and 1000B is measured for constant input when the switchable resistor is toggled between its two states then the polarity of the correction circuit is incorrect in assembly. Accordingly, as discussed supra in respect of FIGS. 1 and 2 DC currents on the input side will impact the measurements such that an incorrect AC current will be measured. Referring to FIGS. 9B and 9C two simple embodiments of DC current sensing are depicted wherein in FIG. 9B first circuit 900D includes a Shunt 934 allowing a measurement of the DC current to be made thereby allowing, for example, an alarm to be triggered when the DC current exceeds a predetermined threshold. However, this DC offset may be difficult to observe and the Shunt 934 may limit the operating range of the measurement instrument including first circuit 900D to provide the Current Transducer. In second circuit 900E a Hall effect sensor 935 is added to monitor the input to primary winding NO and provide sensing of any DC current present on the input. Whilst this removes the loading issue of first circuit 900D the Hall effect sensor 935 induces an inherent offset that must be accounted for and corrected for. Depending upon conductor design to the primary winding NO a configuration such as presented within the prior art of Seitz in U.S. Pat. No. 4,749,939 may be employed for example. Rather than a Hall effect sensor 935 a Flux Gate Detector (FGD) may be employed but these have the drawback that they operate with AC signals themselves, typically at 700-800 Hz and thereby generate noise within the second circuit 900E.

Now referring to FIGS. 10A and 10B there are depicted first and second circuit schematics 1000A and 1000B depicting variants of the Current Transducer (CT) according to an embodiment of the invention. The CT now consists of a dual stage current transformer $CT_R$ 1050A containing primary winding $N_0$ and first and second secondary windings $N_1$ and $N_2$ respectively together with an electrical shield S 930 placed between the primary and the secondary sides and connected to a dedicated shield terminal Sh 900C. First secondary winding $N_1$ is loaded with a precise resistance $R_1$ 931 and second secondary winding $N_2$ is loaded with a precise resistance $R_2$ 932. The High output terminal H 900A of the Current Transducer 1000A is connected to the start connection of secondary winding $N_1$, while the end connection of winding $N_1$ is connected to the start connection of second stage winding $N_2$. End connection of second stage winding $N_2$ is connected to the Low output terminal L 900B of the transducer. Accordingly, current passing through the primary winding $N_0$ produces a proportional voltage between output terminals H 900A and L 900B wherein the winding $N_1$/precise resistance $R_1$ 931 combination provides a correction current applied to that generated by second stage winding $N_2$, precise resistance $R_2$ 932.

In first circuit 1000A, unlike CTR 929 in FIG. 9A, the CTR 1050A now has a Hall sensor 1010 embedded within it which couples via Magnetic Field (MF) 1040A to Processing Circuit 1020 which also receives the output from the modified CTR 929. Accordingly, Processing Circuit 1020 may determine in some embodiments of the invention that the DC current is beyond a threshold established in dependence, for example, upon the magnitude of the AC current and the desired accuracy of the AC current reading. Accordingly, a measurement instrument may allow coarse low accuracy measurements on poorly conditioned input signals but prevent high accuracy measurements until the input signal has been conditioned to the required degree.

In second circuit 1000B, unlike the $CT_R$ 929 in FIGS. 9A through 9C and $CT_R$ 1050A in FIG. 10A, the $CT_R$ 1050B now has a Hall sensor 1010 and a tertiary winding 1020. The Hall sensor 1010 is embedded within the $CT_R$ 1050B and couples via Magnetic Field (MF) 1040A to Processing Circuit 1030 which also receives the output from the modified $CT_R$ 1050B. Accordingly, Processing Circuit 1020 generates a correction current which is coupled to a tertiary winding 1020 with $N_3$ turns also coupled to the $CT_R$ 1050B. Accordingly, the Processing Circuit 1030 now generates a current in dependence upon the measured DC field from Hall sensor 1010 and number of turns $N_3$ in order to generate within the $CT_R$ 1050B a field negating or reducing the DC field present within the $CT_R$ 1050B as a result of the conditioning or lack of conditioning applied to the input signal being analyzed.

Figure 10C:
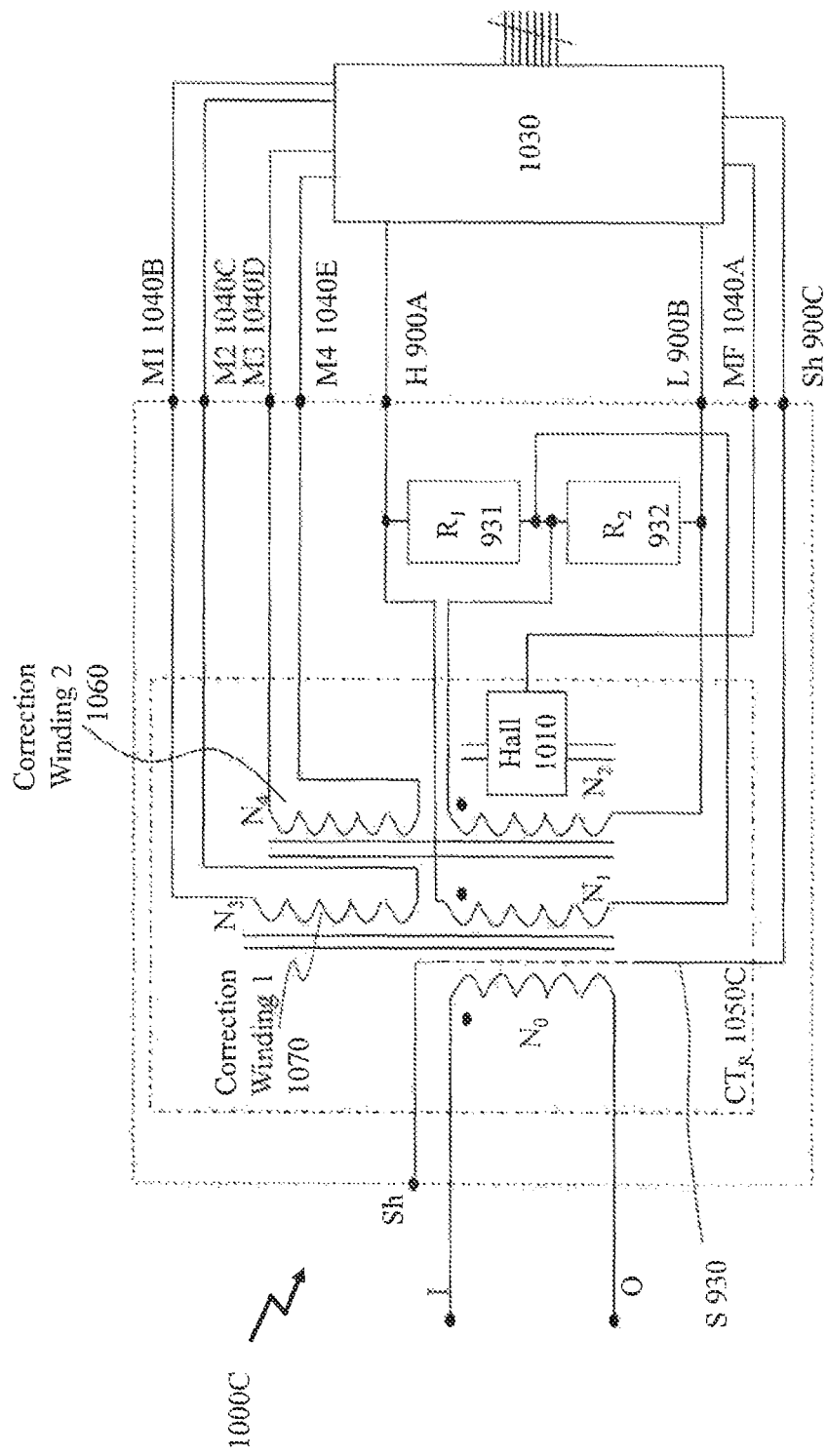

Referring to FIG. 10C there is a third circuit 1000C which is very similar to second circuit 1000B except that in addition to the tertiary winding $N_3$ coupled to the $CT_R$ 1050C there is a quaternary winding $N_4$ coupled together with the second secondary winding $N_2$, these being upon a different core of the Current Transducer to that of the first secondary winding $N_1$ and tertiary winding $N_3$ Tertiary winding $N_3$ and quaternary winding $N_4$ provide Correction Winding 1 1020 and Correction Winding 2 1060 for the two cores of the Current Transducer. Accordingly, corrective magnetic fields may be induced if necessary in multiple cores of a Current Transducer.

According to the design of the Current Transducer that the Hall sensor 1010 may be embedded into one core of a plurality of cores or alternatively multiple Hall sensors 1010 may be embedded such that a Hall sensor 1010 is disposed within each core of the Current Transducer or a predetermined subset of the cores of the Current Transducer.

Figure 11:
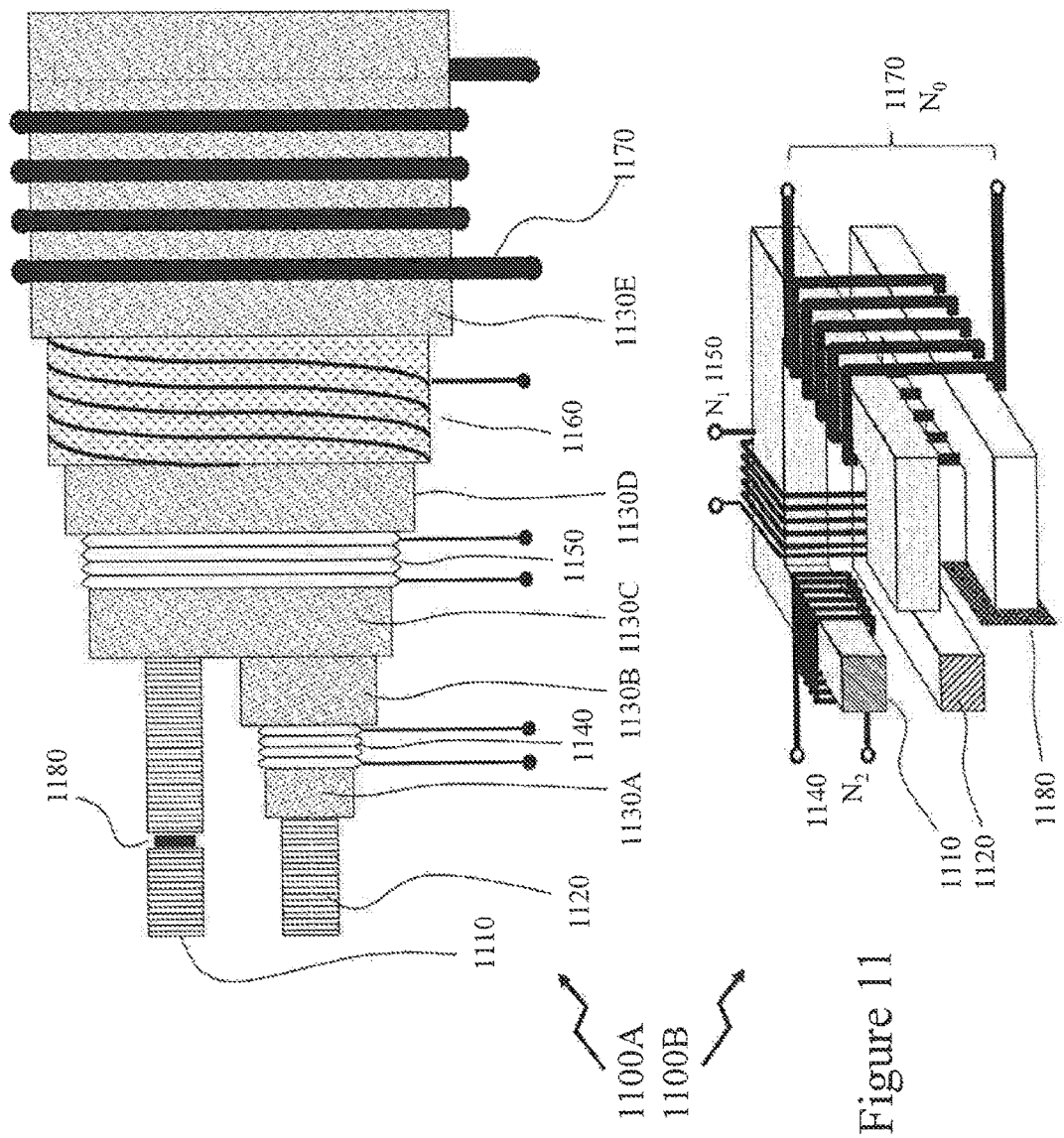
FIG. 11 depicts a two stage current transformer according to an embodiment of the invention which when resistively connected as described in FIG. 10A provides an implementation of a single stage, Current Transducer with Hall sensor based DC flux detection.

Referring to FIG. 11 there is depicted a Current Transducer according to an embodiment of the invention such as described supra in respect of Current Transducer (CT) 1000A in FIG. 10A exploiting a dual-core transformer architecture. Accordingly, first image 1100A depicts the CT sequentially stripped from the outermost layer towards the centre whilst second image 1100B depicts a three dimensional quarter-cut sectional view with first to fifth tape layers 1130A through 1130E respectively and shielding 1160. Accordingly, as shown the CT comprises first and second cores 1110 and 1120 respectively. First core 1110 has embedded within it Hall sensor 1180. Second core 1120 then has first tape layer 1130A separating the first winding 1140 from it which is then overwound with second tape layer 1130B. The first and second cores 1110 and 1120 with their respective surrounding layers are then overwound with third tape layer 1130C. Atop third tape layer 1130C second winding 1150 is wound around both the first and second cores 1110 and 1120 respectively. Second winding 1150 is then overwound by fourth tape layer 1130D, shielding 1160, fifth tape layer 1130E and third winding 1170. As depicted first winding 1140 corresponds to second secondary winding $N_2$ of FIG. 10A, second winding 1150 corresponds to first secondary winding $N_1$ of FIG. 10A, and third winding 1170 corresponds to the primary winding $N_0$ of FIG. 10A. Optionally a second shielding may be disposed between the first and second windings 1140 and 1150 respectively such as between second and third tape layers 1130B and 1130C respectively.

Second image 1100B depicts a three dimensional quarter-cut sectional view with first to fifth tape layers 1130A through 1130E respectively and shielding 1160 removed thereby showing how the first to third windings 1140, 1150 and 1170 respectively are wound around the closed magnetic elements forming the first and second cores 1110 and 1120 respectively. Also depicted within first core 1110 is Hall sensor 1180, for example, within a slot machined within the closed magnetic element forming first core 1110. It would be evident to one skilled in the art that the number of windings for each of the first to third windings 1140, 1150, and 1170 respectively and geometries of the first and second cores 1110 and 1120 respectively may be adjusted according to the electrical voltage, current and power of the signal being measured and design of the Asynchronous Power Measurement System within which the Current Transducer forms part. Accordingly, a Hall sensor such as described supra in respect of FIG. 6, and other variants not depicted, may be inserted into the first core 1110 as depicted or alternatively second core 1120 in order to provide the determination and/or management of a DC field within the Current Transducer. Optionally, multiple Hall sensors 128 may be embedded into one or more cores.

Figure 12:
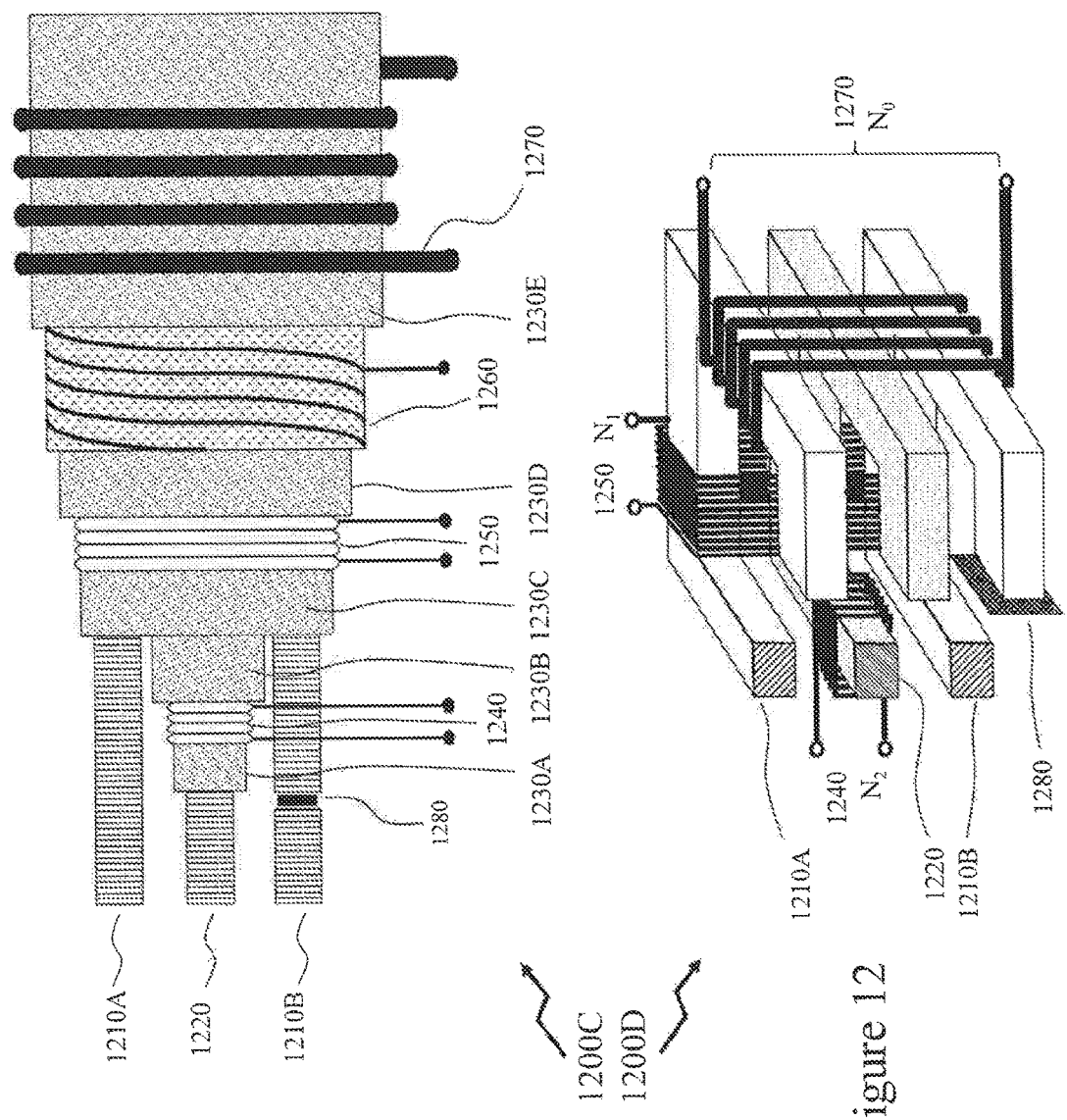
FIG. 12 depicts a two stage current transformer according to an embodiment of the invention utilizing third core for the DC bias detection core which when resistively connected as described in FIG. 10A provides an implementation of a two stage Current Transducer with Hall sensor based DC flux detection.

Referring to FIG. 12 there is depicted a Current Transducer according to an embodiment of the invention such as described supra in respect of Current Transducer (CT) 1000A in FIG. 10A employing a three core transformer architecture. Accordingly, first image 1200C depicts the CT sequentially stripped from the outermost layer towards the centre whilst second image 1200D depicts a three dimensional quarter-cut sectional view with first to fifth tape layers 1230A through 1230E respectively and shielding 1260. Accordingly, as shown the CT comprises first, second, and third cores 1210A, 1220, and 1210B respectively. Second core 1220 then has first tape layer 1230A separating the first winding 1240 from it which is then overwound with second tape layer 1230B. The first, second, and third cores 1210A, 1220, and 1210B respectively with their respective surrounding layers are then overwound with third tape layer 1230C. Atop third tape layer 1230C second winding 1250 is wound around first, second, and third cores 1210A, 1220, and 1210B respectively. Second winding 1250 is then overwound by fourth tape layer 1230D, shielding 1260, fifth tape layer 1230E and third winding 1270. As depicted first winding 1240 corresponds to second secondary winding $N_2$ of FIG. 10, second winding 1250 corresponds to first secondary winding $N_1$ of FIG. 10, and third winding 1270 corresponds to the primary winding $N_c$ of FIG. 10. Optionally a second shielding may be disposed between the first and second windings 1240 and 1250 respectively such as between second and third tape layers 1230B and 1230C respectively. Embedded within third core 1210B is Hall sensor 1280.

Second image 1200D depicts a three dimensional quarter-cut sectional view with first to fifth tape layers 1230A through 1230E respectively and shielding 1260 removed thereby showing how the first to third windings 1240, 1250 and 1270 respectively are wound around the closed magnetic elements forming the first, second, and third cores 1210A, 1220, and 1210B respectively. Also depicted within second image 1200D is Hall sensor 1280 which may be inserted into a slot machined within the third core 1210B. It would be evident to one skilled in the art that the number of windings for each of the first to third windings 1240, 1250, and 1270 respectively and geometries of the first, second, and third cores 1210A, 1220, and 1210B respectively may be adjusted according to the electrical voltage, current and power of the signal being measured and design of the Asynchronous Power Measurement System within which the Current Transducer forms part. Accordingly, a Hall sensor 1280 such as described supra in respect of FIGS. 6A through 6C and FIGS. 11A through 11C, and other variants not depicted, may be inserted into the first, or the third core 1310A, or 1310B in order to provide the determination and/or management of a DC field within the Current Transducer.

Figure 13:
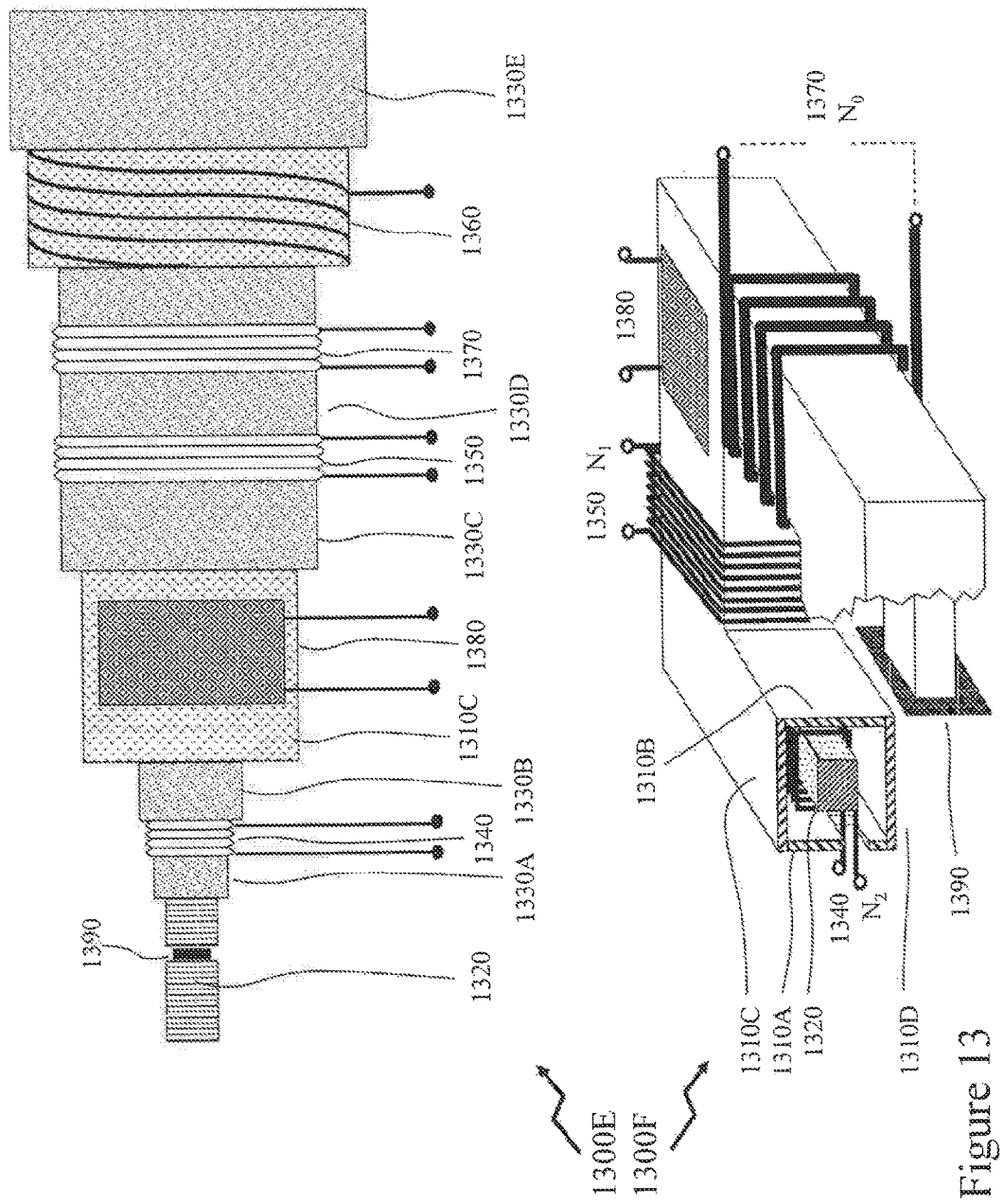
FIG. 13 depicts a dual stage current transformer according to an embodiment of the invention with a magneto-strictive element positioned on the shield which when resistively connected as described in FIG. 10A provides an implementation of the Current Transducer.

Referring to FIG. 13 there is depicted a Current Transducer according to an embodiment of the invention such as described supra in respect of Current Transducer (CT) 1000 in FIG. 10A employing a dual-core current transformer architecture. Accordingly, first image 1300C depicts the CT sequentially stripped from the outermost layer towards the centre whilst second image 1300D depicts a three dimensional quarter-cut sectional view with first to fifth tape layers 1330A through 1330E respectively and shielding 1360. Accordingly, as shown the CT comprises a first core comprising first to fourth core elements 1310A to 1310D respectively surround a second core 1320. Second core 1320 then has first tape layer 1330A separating the first winding 1340 from it which is then overwound with second tape layer 1330B. The first core (first to fourth core elements 1310A to 1310D) and second core 1320 respectively with their respective surrounding layers are then overwound with third tape layer 1330C. Atop third tape layer 1330C second winding 1350 is wound around first core (first to fourth core elements 1310A to 1310D) and second core 1320. Second winding 1350 is then overwound by fourth tape layer 1330D, shielding 1360, fifth tape layer 1330E and third winding 1370. As depicted first winding 1340 corresponds to second secondary winding $N_2$ of FIG. 10, second winding 1350 corresponds to first secondary winding $N_1$ of FIG. 10, and third winding 1370 corresponds to the primary winding $N_0$ of FIG. 10. Optionally a second shielding may be disposed between the first and second windings 1340 and 1350 respectively such as between second and third tape layers 1330B and 1330C respectively.

Second image 1300D depicts a three dimensional quarter-cut sectional view with first to fifth tape layers 1330A through 1330E respectively and shielding 1360 removed thereby showing how the first to third windings 1340, 1350 and 1370 respectively are wound around the closed magnetic elements forming the first, second, and third cores 1310A, 1320, and 1310B respectively. It would be evident to one skilled in the art that the number of windings for each of the first to third windings 1340, 1350, and 1370 respectively and geometries of the first core (first to fourth core elements 1310A to 1310D) and second core 1320 respectively may be adjusted according to the electrical voltage, current and power of the signal being measured and design of the Asynchronous Power Measurement System within which the Current Transducer forms part. Further, a Hall sensor 1390 as described supra in respect of FIGS. 6A through 6C and FIGS. 11A through 11C is disposed within the second core 1320 in order to provide the determination and/or management of a DC field within the Current Transducer.

Also depicted in FIG. 13 disposed upon third first core element 1310C is a magneto-strictive film 1380 which adjusts a dimension in respect to a magnetic field. Accordingly, the magneto-strictive film 1380 will increase/decrease in length along the axis of third first core element 1310C when orientated appropriately such that the DC resistance of a thin-film upon the surface of the third first core element 1310C or the third first core element 1310C itself varies with the DC field within the third first core element 1310C. Optionally, magneto-strictive elements may be disposed upon each of the first to fourth first core elements 1310A through 1310D respectively, and second core 1320 respectively and coupled to a Processing Circuit for processing in order to define an action, such as an alarm or provisioning of a compensation signal such as described above in respect of FIGS. 11A through 11C for example. Optionally, the magneto-strictive element 1380 may be employed in conjunction with a Hall sensor disposed within the second core 1320. Optionally, multiple Hall sensors 1390 and magneto-strictive elements 1380 may be employed in conjunction with one another within/upon one or more magnetic cores of a Current Transformer.

Figure 14:
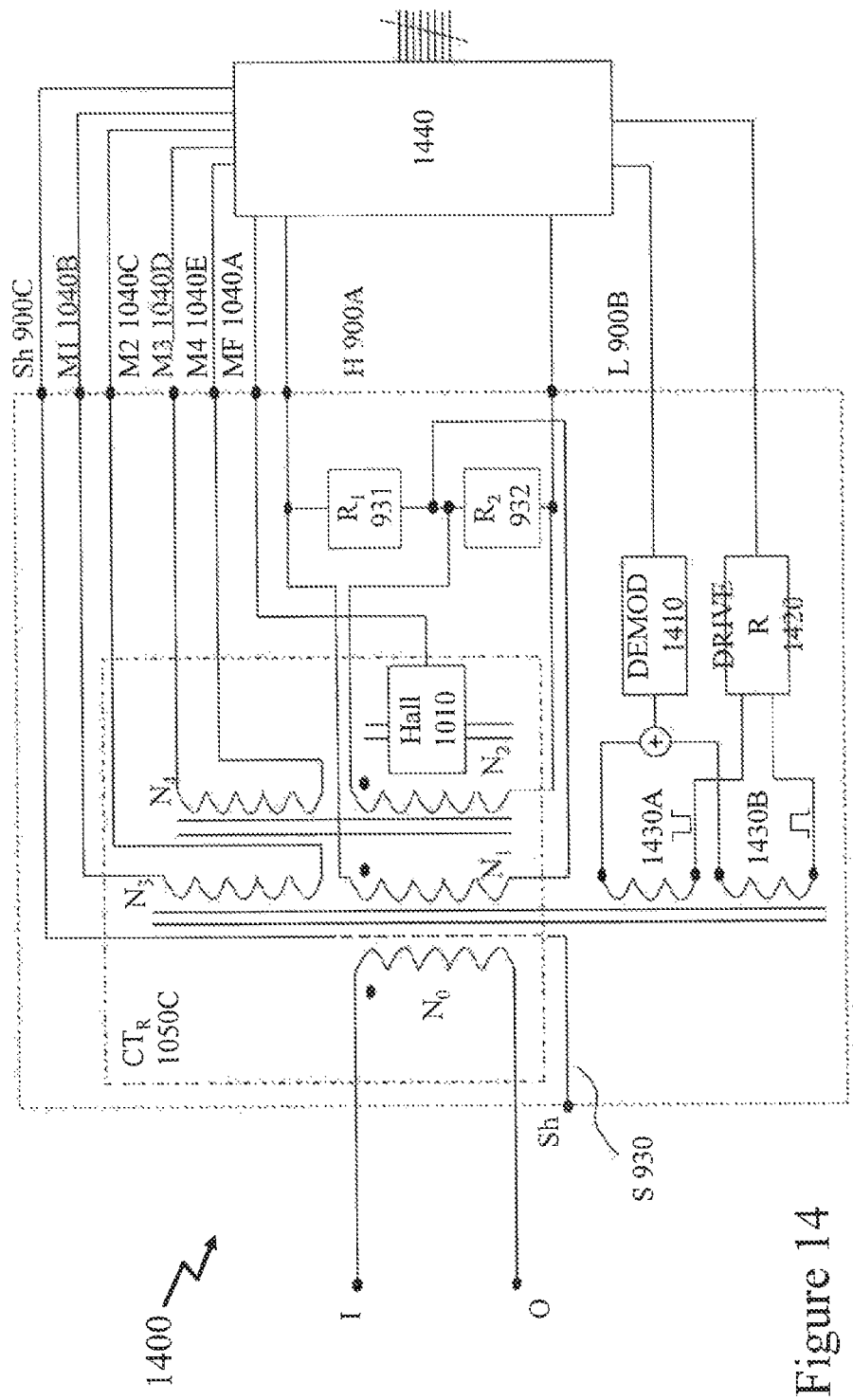
FIG. 14 schematically an electrical circuit of a multi-core current transformer according to an embodiment of the invention.

Accordingly, it would be evident that Current Transducers as depicted in respect of FIGS. 11 through 13 may be amended to incorporate either a tertiary winding $N_3$ in isolation or a tertiary winding $N_3$ and quaternary winding $N_4$ such as described supra in respect of FIGS. 10A through 10C for example. Such a configuration is depicted in FIG. 14 by electrical circuit 1400 of a multi-core current transformer according to an embodiment of the invention. As depicted a $CT_R$ 1050C, as described supra in respect of FIG. 10C, is augmented with first and second fluxgate coils 1430A and 1430B respectively. As depicted each of the first and second fluxgate coils 1430A and 1430B respectively are coupled to fluxgate driver 1420 which provides square wave and inverted square wave signals and the output signals from the first and second fluxgate coils 1430A and 1430B respectively are coupled to a summation circuit and demodulator (DEMOD) 1410. Each of the DEMOD 1410 and driver 1420 are coupled to Processing Circuit 1440. As depicted first and second fluxgate coils 1430A and 1430B respectively are excited with equal currents but in opposite directions thereby cancelling the overall effect upon the core of $CT_R$ 1050C. Processing circuit 1440 may provide processing of the DEMOD 1410 in hardware and/or software or a combination thereof. For example, according to an embodiment of the invention processing circuit 1440 provides a square wave signal which comprises only odd harmonics such that effect of any magnetic field within the associated core of $CT_R$ 1050C is to generate distorted output signals with even order harmonics which are filtered from the output of DEMOD 1410 by a second order low pass filter prior to being amplified and coupled to an integrator which also receives the output from the dual-stage current transformer within $CT_R$ 1050C.

Within FIGS. 10A and 14 there are depicted Correction Winding 1 1020 and Correction Winding 2 1060 in conjunction with the first and second secondary windings respectively and their associated cores within the transformer. It would be evident to one skilled in the art that only one or other of the Correction Winding 1 1020 and Correction Winding 2 1060 may be employed.

Figure 15:
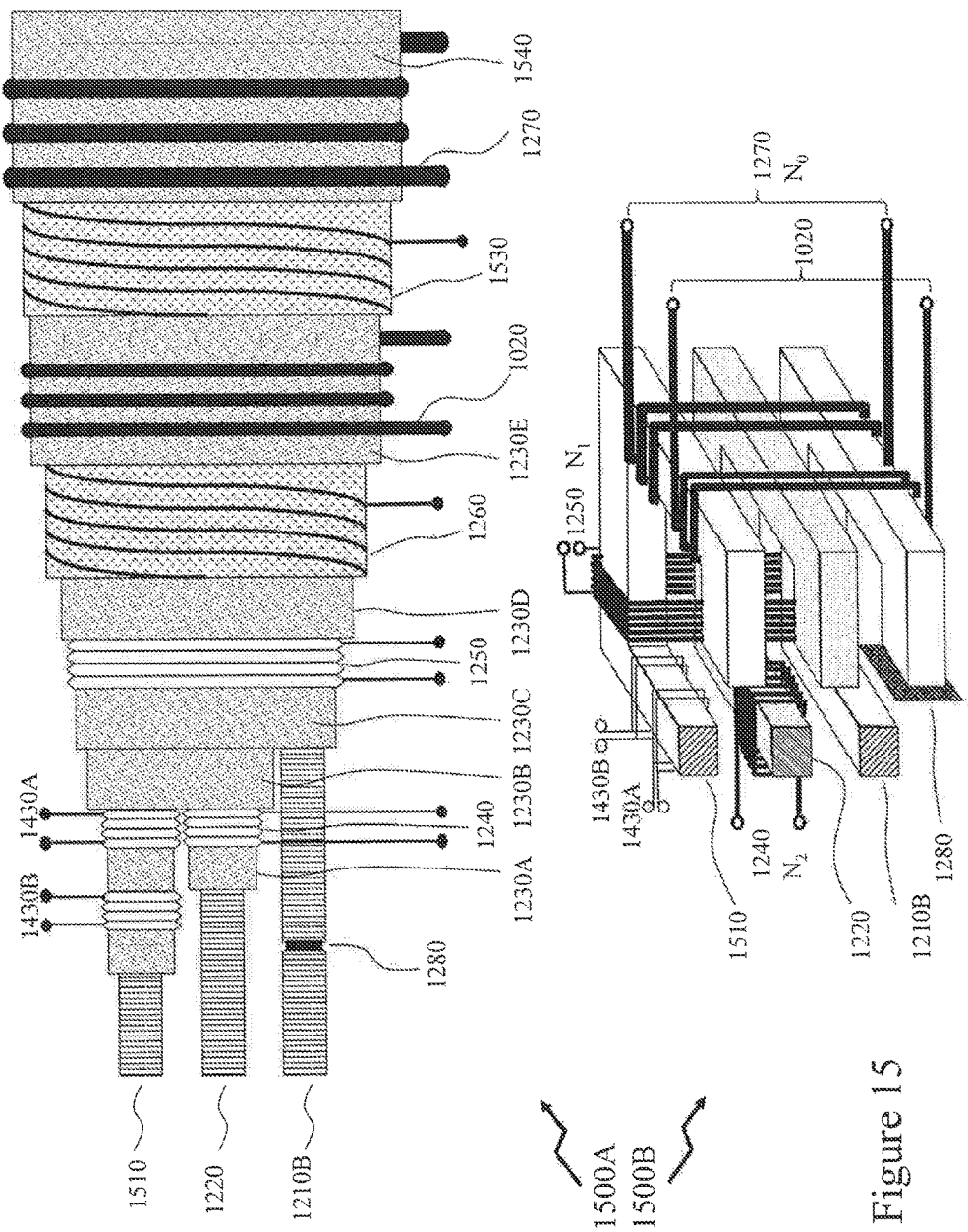
FIG. 15 depicts a two stage current transformer according to an embodiment of the invention utilizing a third core for the DC bias detection core which when resistively connected as described in FIG. 14 provides an implementation of a two stage Current Transducer with DC flux detection using fluxgate detectors and Hall sensor.

FIG. 15 depicts a two stage current transformer in first and second images 1500A and 1500B respectively according to an embodiment of the invention utilizing a third core for the DC bias detection core which when resistively connected as described in FIG. 14 provides an implementation of a two stage Current Transducer with DC flux detection. Accordingly, the majority of the structures depicted in first and second images 1500A and 1500B respectively are common to the descriptions supra in respect of first and second images 1200C and 1200D in FIG. 12 reflecting the third circuit 1000C in FIG. 10C. However, in addition to the elements in common with these first and second images 1200C and 1200D the first and second images 1500A and 1500B also depict first and second fluxgate coils 1430A and 1430B respectively together with Compensation Coil 1

1020. As depicted is second image 1500B the Compensation Coil 1020 is disposed around first core 1510, second core 1220, and third core 1210B as is primary winding, third winding 1270. Hall sensor 1280 is depicted disposed within third core 1210B. Accordingly, in first image 1500A the Compensation Coil 1020 is now formed upon the fifth tape layer 1230E upon which is wound second Shield 1530, sixth tape layer 1540, and third winding 1270.

Figure 16:
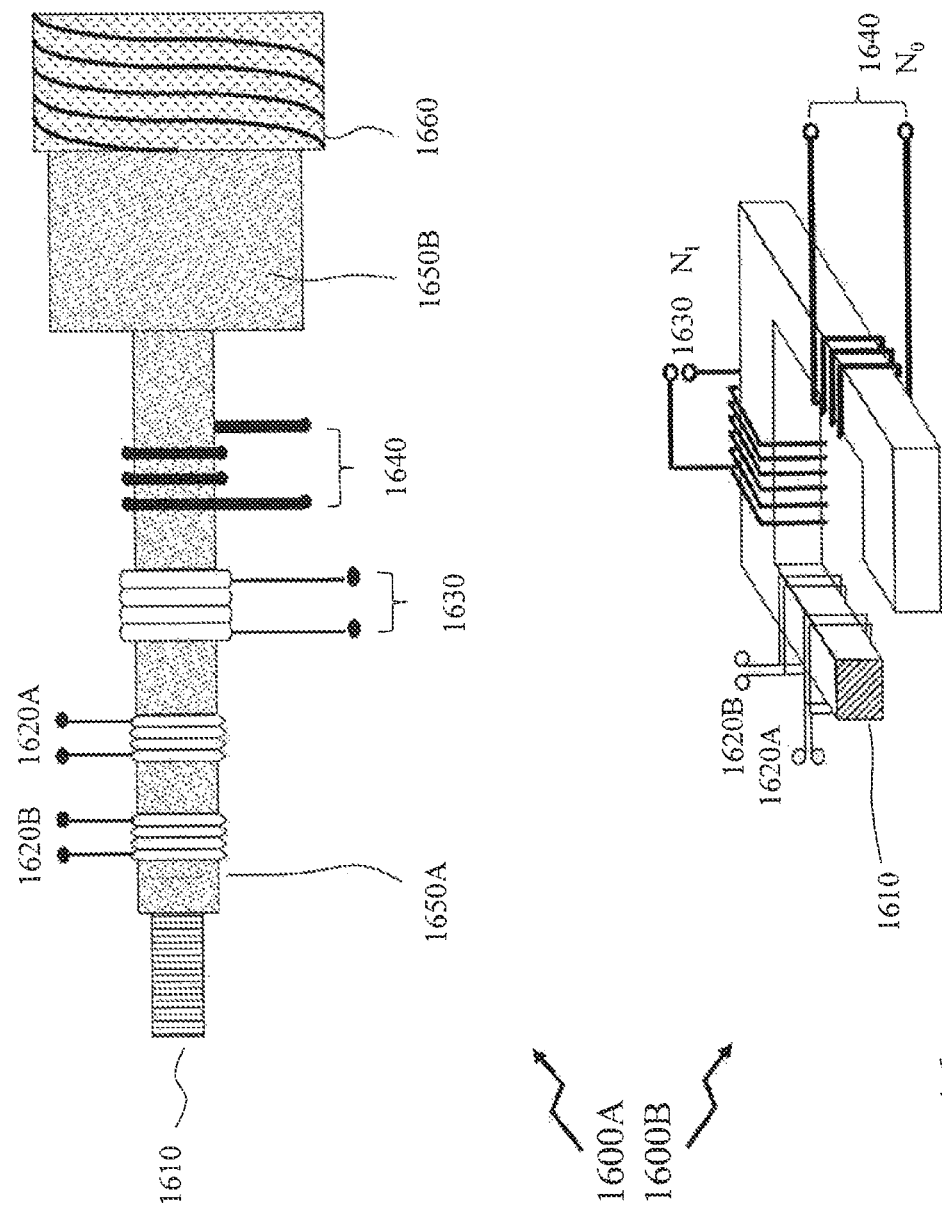
FIG. 16 depicts a current comparator according to the embodiment of the invention, utilizing a flux gate detector to detect input and output current-turn balance wherein the prior art magnetic shield between the magnetic sensor and the primary and secondary windings is removed.

Now referring to FIG. 16 there is depicted a current comparator in first and second images 1600A and 1600B respectively according to the embodiment of the invention, utilizing first and second fluxgate coils 1620A and 1620B respectively to detect input and output current-turn balance wherein there is no magnetic shield between the magnetic sensor and the primary and secondary windings in contrast to prior art toroidal transformers. Accordingly, as depicted in second image 1600B the primary coil 1630, with turns $N_1$, and secondary coil 1640, with turns $N_0$, are wound around a single core 1610 together with first and second fluxgate sensors 1620A and 1620B respectively. As depicted in first image 1600A the primary winding 1630, secondary winding 1640, and first and second fluxgate sensors 1620A and 1620B are wound around the single core 1610 with first tape layer 1650A. Surrounding all of these are second tape layer 1650B and shield 1660. The inventors have established that other magnetic shield(s) can be removed where the toroidal transformer establishes the magnetic flux from the primary winding 1630 primarily through the magnetic core 1610 which is achieved through precision control of the windings in conjunction with a high quality magnetic core and low loading from the secondary winding 1640. Alternatively, the magnetic core if the current comparator depicted within first and second images 1600A and 1600B of FIG. 16 may be a dual-core or multi-core design.

Within an embodiment of the invention operation of the current comparator depicted in FIG. 16 exploits the magnetic core 1610 as part of a magnetic field sensing apparatus continuously magnetized back and forth from saturation in one direction to saturation in the other direction wherein the time required to drive the magnetic core from saturation to saturation is used as a measure of the magnetic field strength. Within another embodiment of the invention two magnetic cores are employed in conjunction with a push-pull drive circuit for driving them from saturation to saturation thereby producing a differential output signal which beneficially reduces the coupling effects of the higher power magnetic drive circuit on the lower level output signal.

Figure 17A:
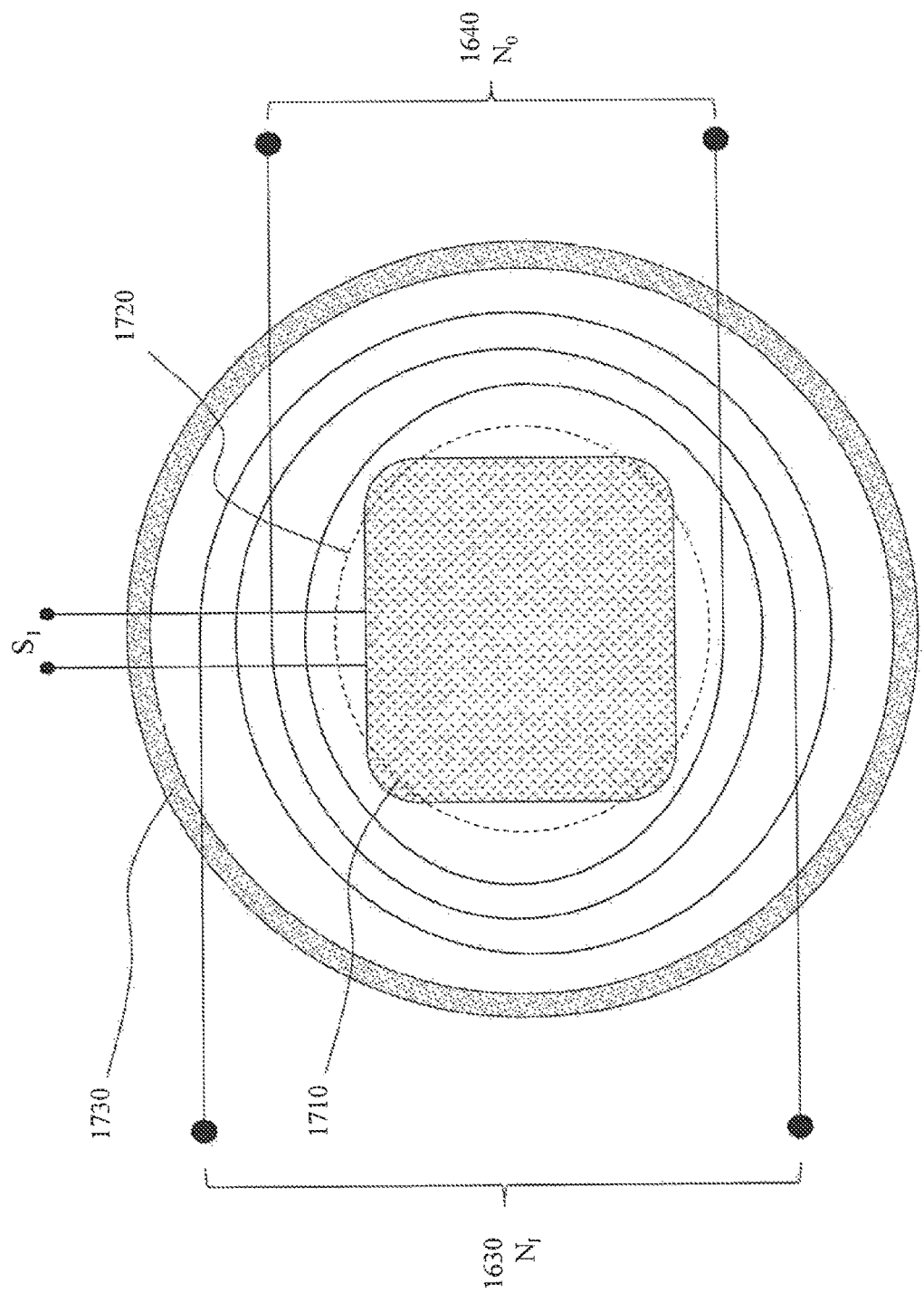
FIGS. 17A and 17B depict a current comparator according to the embodiment of the invention utilizing Hall Effect magnetic sensors to detect input and output current-turn balance wherein the prior art magnetic shield between the magnetic sensor and the primary and secondary windings is removed.
Figure 17B:
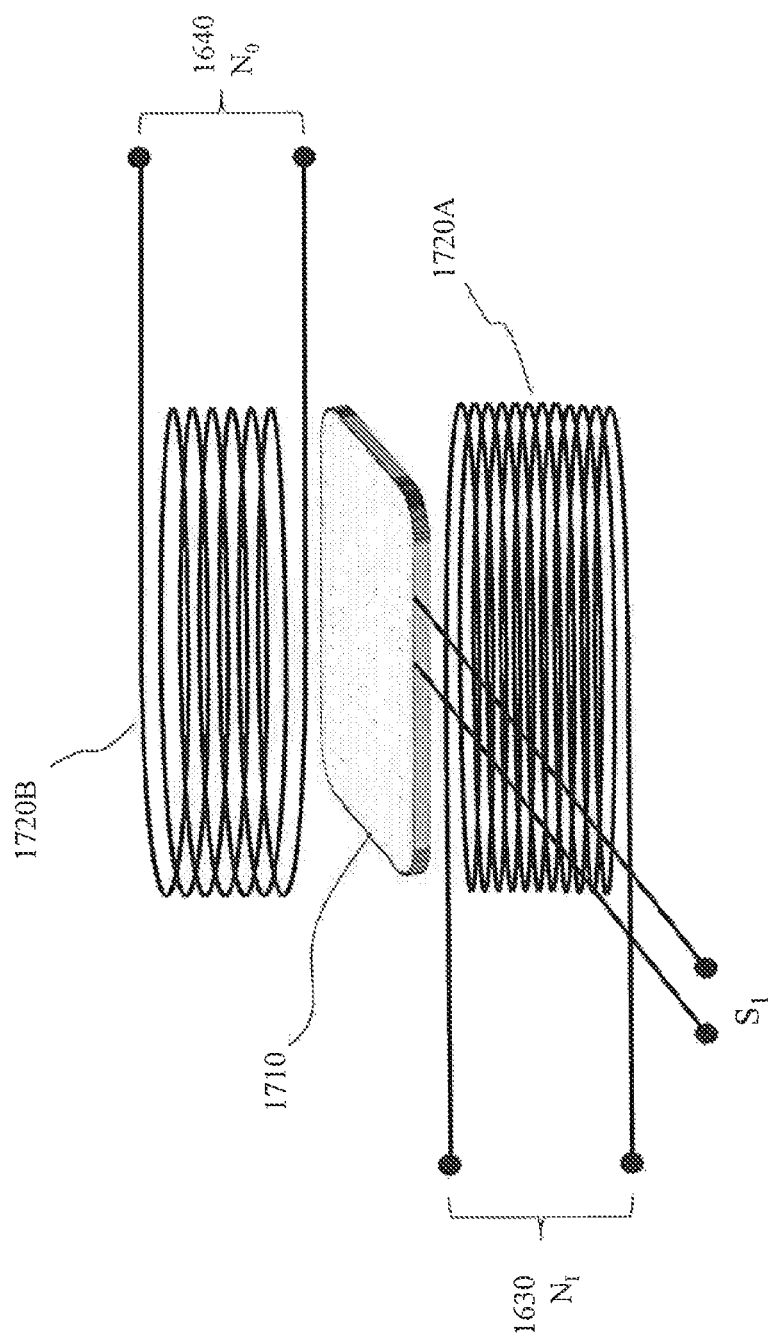

Referring to FIGS. 17A and 17B there are depicted current comparators according to an embodiment of the invention utilizing a Hall Effect magnetic sensor 1710 embedded within the magnetic core 1720 of the current comparator to detect input and output current-turn balance wherein the prior art magnetic shield between the magnetic sensor and the primary and secondary windings has been removed. As depicted in the cross-section of the current comparator comprises the Hall Effect magnetic sensor 1710 "around" which are wound the primary coil 1630 and secondary coil 1640 with the assembly then surrounded by magnetic shield 1730 which shields the current comparator from external magnetic fields. Optionally, a magnetic circuit may be employed in conjunction with the configuration depicted in FIG. 17A in order to concentrate magnetic field on the Hall effect magnetic sensor 1710 depending upon the geometry of the Hall effect magnetic sensor 1710 and the primary and second coils 1630 and 1640 respectively. However, adding such a magnetic element introduces hysteresis and impacts accuracy.

In contrast in FIG. 17B the primary coil 1630 is formed below the Hall Effect magnetic sensor 1710 and the secondary coil 1640 is formed above it. In this manner the primary and secondary coils 1630 and 1640 respectively may be manufactured and characterized independent from the overall transformer. Optionally, as with FIG. 17A magnetic field concentrator(s) may be employed to concentrate the magnetic field on the Hall effect magnetic sensor 1710.

The current comparator depicted in FIG. 16 represents a design wherein the primary and secondary coil windings are implemented directly on the magnetic core. In contrast the current comparator depicted in FIGS. 17A and 17B exploits a magnetic sensor (Hall Effect) and may be implemented as a "planar" design although it may also be made as a toroid and may employ a number of Hall Effect (or other) sensors, or a single sensor with the magnetic field concentrator, for example a magnetic core with a cut slot.

Figure 18:
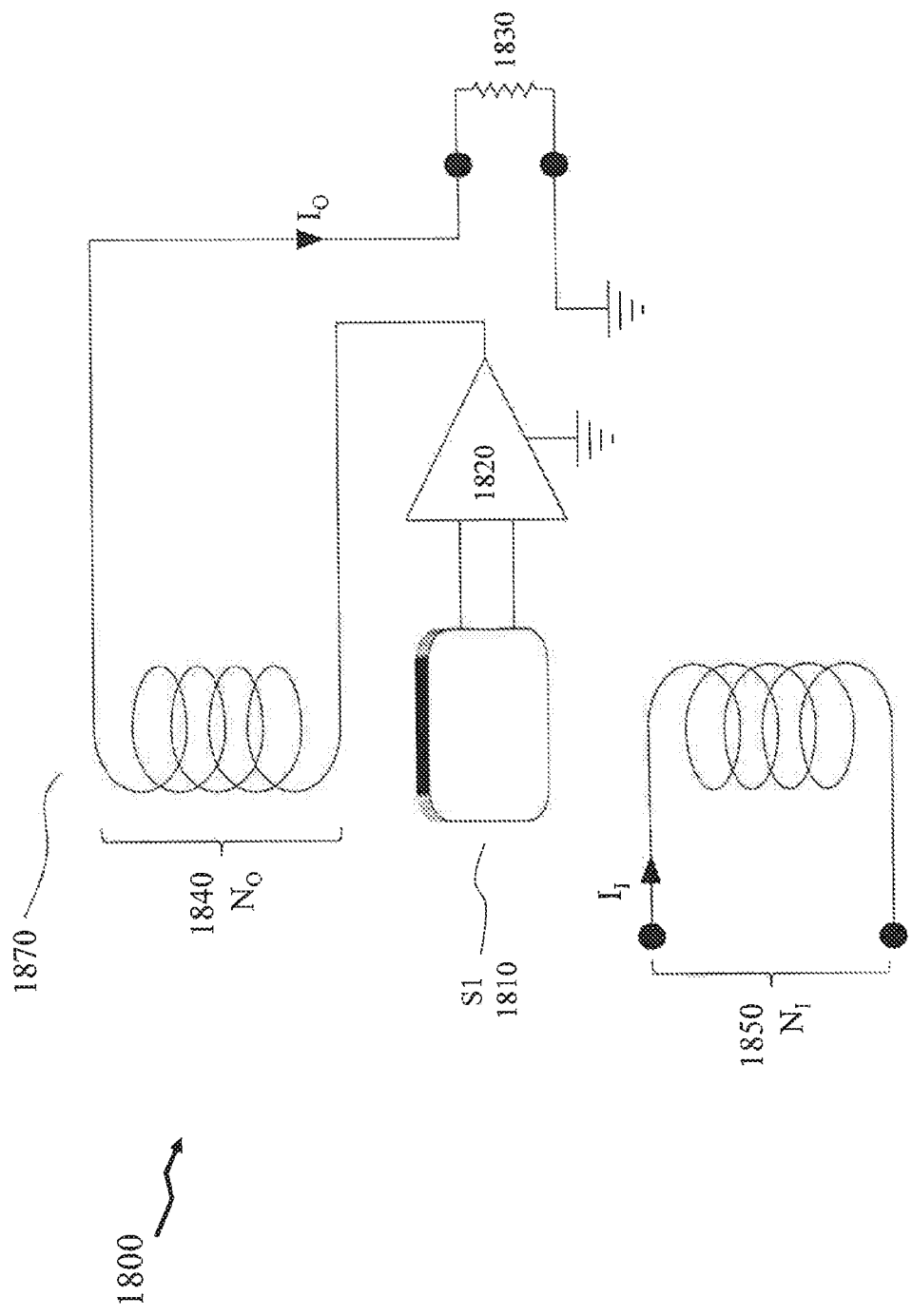
FIG. 18 depicts an active current to current transducer according to the embodiment of the invention utilizing current comparator with a magnetic sensor and an amplification block to produce AC and DC output current in precise ratio to the input current.

Referring to FIG. 18 there is depicted an active current to current transducer (AC-CT) 1800 according to the embodiment of the invention utilizing current comparator with a magnetic sensor 1810 within magnetic core 1870 and an amplification block 1820 to produce AC and DC output current in precise ratio to the input current. Accordingly, an input current $I_1$ within a primary coil 1850 induces a magnetic flux within the magnetic core 1870 which is detected by magnetic sensor 1810. The output of the magnetic sensor 1810 is amplified by amplification block 1820 and coupled to the secondary coil 1840. Accordingly, the operation of the AC-CT 1800 may be viewed as an AC amplifier with transformer feedback although the operation is significantly different in that within the AC-CT 1800 the aim, rather than compensate the input voltage with the transformed output voltage, is to compensate a first magnetic flux generated by the current flowing within the input winding with a magnetic flux generated in the output winding, such that the overall induced magnetic flux as measured by the magnetic sensor 1810 is approximately equal to zero. It would be evident to one skilled in the art that this scheme is good for both AC current transduction as well as DC transduction. The concept of the AC-CT 1800 is similar to that employed within DC comparator resistance bridges. The physical implementations of AC-CT 1800, in common with the current transducers depicted in FIGS. 16 and 17, are absent magnetic shield(s) except external to the overall assembly in order to protect the current transducers from external magnetic fields only. However, such external magnetic shields are not essential from the conceptual viewpoint although they will be beneficial in reducing external electromagnetic interference fields do lower the "noise" level of the implementations.

Alternatively, with respect to embodiments of the invention, the transformer may be shell form or a combination of core and shell forms. Shell form designs may be more prevalent than core form designs for distribution transformer applications due to the relative ease in stacking the core around the winding coils. Core form designs tend to, as a general rule, be more economical, and therefore more prevalent, than shell form designs for high voltage power transformer applications at the lower end of their voltage and power rating ranges. At higher voltage and power ratings, shell form transformers tend to be more prevalent. Shell form design tends to be preferred for extra high voltage and higher MVA applications because, though more labor intensive to manufacture, shell form transformers are characterized as having inherently better kVA-to-weight ratio, better short-circuit strength characteristics and higher immunity to transit damage. However, it would be evident that embodiments of the invention may be applied to core form, shell form, and combination core-shell form transformers.

Figures 1, 2:
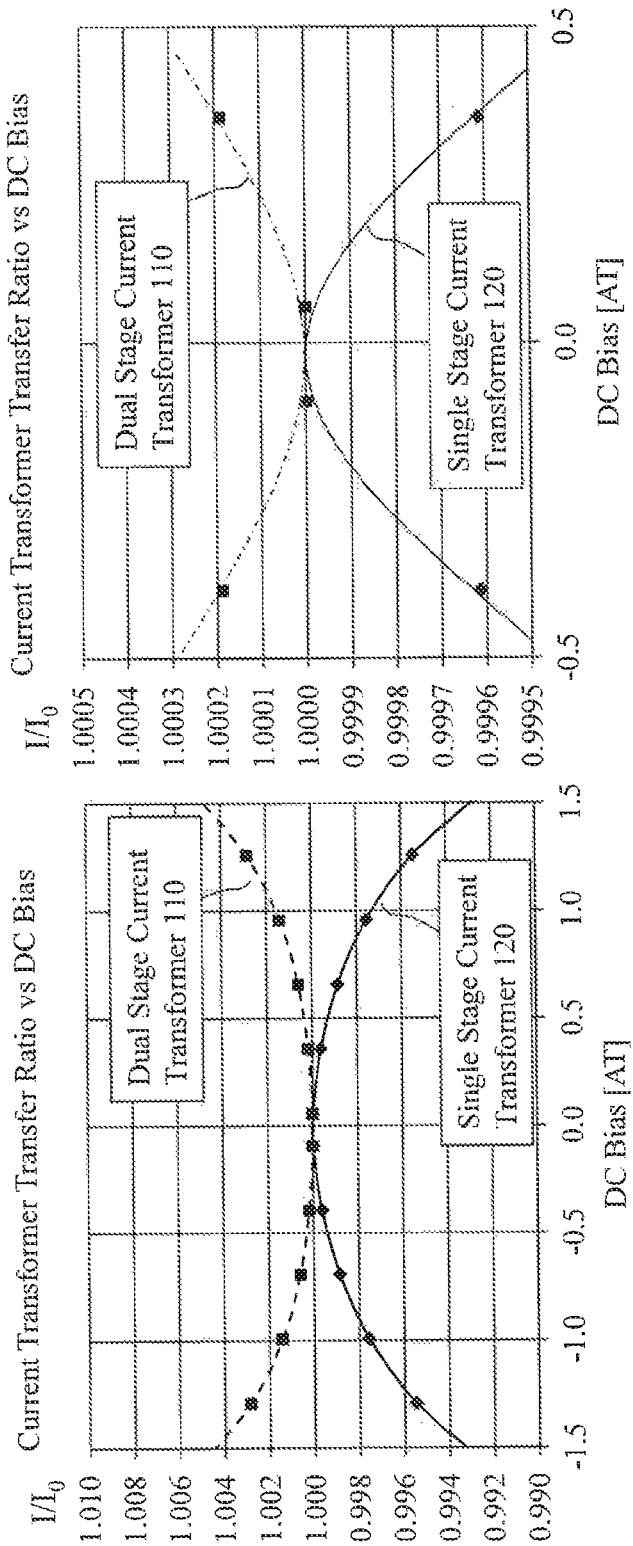
FIGS. 1 and 2 depict the measurement ratio, $I/I_O$, of toroidal single stage and dual stage AC current transformers with varying DC current expressed in ampere-turns (AT)

Within the descriptions presented supra in respect of FIGS. 10A through 14 the determination of corrections and alarms has been presented based upon determinations of DC magnetic fields arising from DC currents in respect to measurements of AC currents. In respect of corrections these are described primarily as being applied through the generation of opposing magnetic fields within the Current Transducer or the triggering of an alarm in respect of terminating a measurement, providing a warning, or truncating the measurements to a predetermined accuracy for example. However, as depicted in FIGS. 1 and 2 there is a surface or plurality of surfaces relating the error in an AC current measurement to the DC current and the AC current. Accordingly, within another embodiment of the invention the Processing Circuit depicted within FIGS. 11A through 11C may digitize the measured AC current and apply one or more corrections based upon one or more corrective algorithms to the digitized AC current based upon characterisation of these one or more surfaces. Such algorithms may be common to all measurement systems exploiting common coefficients or may be common algorithms exploiting coefficients derived from a characterisation of the Current Transducer wherein the derived coefficients are stored within a memory associated with the Processing Circuit.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

What is claimed is:

1. A method of improving the AC accuracy of a dual stage transformer comprising:
   providing the dual stage current transformer comprising a plurality of magnetic cores, a primary winding, a first secondary winding, and a second secondary winding; either
   providing a first resistor across only the first secondary winding to generate a first voltage and providing a second resistor across only the second secondary winding, the second resistor disposed in series with the first resistor in order to add a compensating voltage to the first voltage; or
   connecting a first end of the first secondary winding to a first end of the second secondary winding at a midpoint of a pair of load resistors disposed in series, connecting a second end of the first secondary winding to another end of a first load resistor of the pair of load resistors and to a first input of a differential amplifier via a first resistor, and coupling another end of the other load resistor of the pair of load resistors and to a second input of the differential amplifier via a second resistor, where the first ends of the first and second secondary windings are both disposed in the same direction along a magnetic core of the plurality of magnetic cores relative to their respective second ends;
   measuring a DC signal within a second stage of the dual stage transformer, the DC signal generated in dependence upon a DC aspect of a signal applied to a first stage of the dual stage transformer;
   measuring an AC signal applied to the first stage of the dual stage transformer, the AC signal measurement being made across the first and second resistors; and
   generating with a processing circuit a corrected AC signal measurement in dependence upon the measured DC signal and the measured AC signal.

2. The method according to claim 1, wherein measuring the DC signal comprises at least one of: disposing a magnetic field sensor within a core of the second stage of the dual stage transformer; and disposing a magnetic field sensor upon a surface of the second stage of the dual stage transformer.

3. The method according to claim 1, further comprising applying a predetermined magnetic field to the first stage of the dual stage transformer, wherein the predetermined magnetic field is determined by the processing circuit in dependence upon at least the DC signal.

4. The method according to claim 3, further comprising applying a first predetermined magnetic field to the first stage of the dual stage transformer;
   applying a second predetermined magnetic field to the second stage of the dual stage transformer;
   wherein the first and second predetermined magnetic fields are determined by the processing circuit in dependence upon at least the DC signal.

5. The method according to claim 1, wherein generating a corrected measurement of the measured AC signal comprises applying a correction derived from a predetermined mathematical function with the DC signal as a variable having coefficients established at least one of generically for all transducers and specifically the transducer.

6. The method according to claim 1, wherein the processing circuit integrates an output signal from a magnetic sensor disposed within a core of the second stage or upon a core of the second stage of the dual stage transformer thereby allowing operation of the magnetic sensor with small AC flux components and improved AC to DC signal ratio.

7. A dual stage AC transformer comprising:
   first and second transformer stages, a primary winding, a first secondary winding, and a second secondary winding;
   a first resistor across only the first secondary winding thereby generating a first voltage in dependence of a current flowing within a first stage of the dual stage AC transformer;

a second resistor across only the second secondary winding, the second resistor disposed in series with the first resistor in order to add a compensating voltage to the first voltage, the compensating voltage generated in dependence of a current flowing within a second stage of the dual stage AC transformer;

a DC magnetic sensor coupled to the second stage of the dual stage AC transformer for generating a signal proportional to a DC magnetic field within the dual stage current transformer;

and a processing circuit for generating a corrected AC signal measurement in dependence upon the output of the DC magnetic sensor and the voltage across the first resistor and the second resistor.

8. The dual stage AC transformer according to claim 7, wherein the DC magnetic sensor is at least one of: disposed within a core of the second stage of the dual stage transformer; and disposed upon a surface of the second stage of the dual stage transformer.

9. The dual stage AC transformer according to claim 7, wherein a predetermined magnetic field is applied to the first stage of the dual stage transformer, wherein the predetermined magnetic field is determined by the processing circuit in dependence upon at least the DC signal.

10. The dual stage AC transformer according to claim 7, wherein generating a corrected measurement of the measured AC signal comprises applying a correction derived from a predetermined mathematical function with the DC signal as a variable having coefficients established at least one of generically for all transducers and specifically the transducer.

11. The dual stage AC transformer according to claim 7, wherein; a first predetermined magnetic field is applied to the first stage of the dual stage transformer; a second predetermined magnetic field is applied to the second stage of the dual stage transformer; wherein the first and second predetermined magnetic fields are determined by the processing circuit in dependence upon at least the DC signal.

12. The dual stage AC transformer according to claim 7, wherein the processing circuit integrates an output signal from a magnetic sensor disposed at least one of within a core of the second stage and upon a core of the second stage of the dual stage transformer thereby allowing operation of the magnetic sensor with small AC flux components and improved AC to DC signal ratio.

13. A dual stage AC transformer comprising:
first and second transformer stages, a primary winding, a first secondary winding, and a second secondary winding, wherein a first end of the first secondary winding is coupled to a first end of the second secondary winding at a midpoint of a pair of load resistors disposed in series;
a second end of the first secondary winding is coupled to another end of a first load resistor of the pair of load resistors and to a first input of a differential amplifier via a first resistor; and
a second end of the second secondary winding is coupled to another end of the other load resistor of the pair of load resistors and to a second input of a differential amplifier via a second resistor;
wherein the first ends of the first and second secondary windings are both disposed in the same direction along a magnetic core of the plurality of magnetic cores relative to their respective second ends;
a DC magnetic sensor coupled to a second stage of the dual stage AC transformer for generating a signal proportional to a DC magnetic field within the dual stage current transformer; and
a processing circuit for generating a corrected AC signal measurement in dependence upon the output of the DC magnetic sensor and the voltage across the first and second resistors.

14. The dual stage AC transformer according to claim 13, wherein the DC magnetic sensor is at least one of: disposed within a core of the second stage of the dual stage transformer; and disposed upon a surface of the second stage of the dual stage transformer.

15. The dual stage AC transformer according to claim 13, wherein a predetermined magnetic field is applied to the first stage of the dual stage transformer, wherein the predetermined magnetic field is determined by the processing circuit in dependence upon at least the DC signal.

16. The dual stage AC transformer according to claim 13, wherein generating a corrected measurement of the measured AC signal comprises applying a correction derived from a predetermined mathematical function with the DC signal as a variable having coefficients established at least one of generically for all transducers and specifically the transducer.

17. The dual stage AC transformer according to claim 13, wherein;
a first predetermined magnetic field is applied to the first stage of the dual stage transformer;
a second predetermined magnetic field is applied to the second stage of the dual stage transformer;
wherein the first and second predetermined magnetic fields are determined by the processing circuit in dependence upon at least the DC signal.

18. The dual stage AC transformer according to claim 13, wherein the processing circuit integrates an output signal from a magnetic sensor disposed at least one of within a core of the second stage and upon a core of the second stage of the dual stage transformer thereby allowing operation of the magnetic sensor with small AC flux components and improved AC to DC signal ratio.

19. A coreless AC transformer comprising:
a magnetic field sensor;
a primary winding for connection to an electrical circuit;
a secondary winding for generating a measurement current to be employed in determining a current flowing within the electrical circuit to which the primary winding is connected; and
the primary winding and secondary winding are in either;
a first configuration wherein the primary winding and secondary winding are axially aligned and disposed either side of the magnetic field sensor; or
in a second configuration wherein the primary winding and secondary winding are axially aligned and disposed such that the magnetic field sensor is disposed within both the primary winding and the secondary winding; wherein
the primary winding, second winding, and magnetic field sensor are not coupled via a magnetic material.

20. The coreless AC transformer according to claim 19, wherein the magnetic field sensor outputs are coupled to a differential amplifier;
the output of the differential amplifier is coupled to one end of the secondary winding; and
the other end of the secondary winding is coupled to ground via a resistor.

* * * * *